United States Patent
Ashida

(10) Patent No.: US 8,248,846 B2
(45) Date of Patent: Aug. 21, 2012

(54) MAGNETIC MEMORY DEVICE, AND MANUFACTURING METHOD THEREOF

(75) Inventor: Motoi Ashida, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 359 days.

(21) Appl. No.: 12/728,920

(22) Filed: Mar. 22, 2010

(65) Prior Publication Data
US 2010/0246253 A1 Sep. 30, 2010

(30) Foreign Application Priority Data

Mar. 27, 2009 (JP) ................................. 2009-079229

(51) Int. Cl.
*G11C 11/15* (2006.01)

(52) U.S. Cl. ........ 365/173; 365/171; 365/158; 365/130; 365/66; 365/55; 365/51

(58) Field of Classification Search .................. 365/173, 365/171, 158, 130, 66, 55, 51
See application file for complete search history.

(56) References Cited

U.S. PATENT DOCUMENTS

| | | | |
|---|---|---|---|
| 6,236,590 B1 | 5/2001 | Bhattacharyya et al. | |
| 6,724,653 B1 * | 4/2004 | Iwata et al. | 365/158 |
| 6,781,874 B2 * | 8/2004 | Hidaka | 365/171 |
| 6,788,568 B2 * | 9/2004 | Hidaka | 365/158 |
| 6,795,339 B2 * | 9/2004 | Ooishi | 365/171 |
| 6,862,210 B2 * | 3/2005 | Tsuchida et al. | 365/158 |
| 6,879,513 B2 * | 4/2005 | Ooishi | 365/158 |
| 6,894,922 B1 * | 5/2005 | Hidaka | 365/158 |
| 6,909,130 B2 * | 6/2005 | Yoda et al. | 257/295 |
| 6,944,048 B2 * | 9/2005 | Iwata | 365/158 |
| 6,954,374 B2 * | 10/2005 | Hidaka | 365/171 |
| 7,038,939 B2 * | 5/2006 | Amano et al. | 365/158 |
| 7,079,414 B2 * | 7/2006 | Iwata et al. | 365/158 |
| 7,145,796 B2 * | 12/2006 | Fukuzumi et al. | 365/158 |

FOREIGN PATENT DOCUMENTS

JP 2002-118239 4/2002

* cited by examiner

*Primary Examiner* — Viet Q Nguyen
(74) *Attorney, Agent, or Firm* — McDermott Will & Emery LLP

(57) ABSTRACT

To provide a magnetic memory device that can suppress the reduction of function of a magnetic memory element, and a manufacturing method thereof. A magnetic memory device includes a magnetic memory element capable of holding data based on a magnetized state thereof, and a digit line and a bit line which are capable of changing the magnetized state of the magnetic memory element by a magnetic field generated. The magnetic memory element is disposed above the digit line and the bit line at an intersection part of the digit line and the bit line. The digit line has a first width at the intersection part, and the bit line has a second width at the intersection part. The first width is larger than a third width of the magnetic memory element, and the second width is smaller than a fourth width of the magnetic memory element.

8 Claims, 19 Drawing Sheets

MAGNETIC MEMORY DEVICE, AND MANUFACTURING METHOD THEREOF

CROSS-REFERENCE TO RELATED APPLICATIONS

The disclosure of Japanese Patent Application No. 2009-79229 filed on Mar. 27, 2009 including the specification, drawings and abstract is incorporated herein by reference in its entirety.

BACKGROUND OF THE INVENTION

The present invention relates to semiconductor memory devices, and more specifically, a magnetic memory device including a magnetoresistive random access memory (MRAM), and a manufacturing method thereof.

The MRAM is a device for storing information by magnetism. The MRAM has advantages in high-speed operation, resistance to rewriting, nonvolatility, and the like, as compared to other memory techniques. The typical MRAM includes bit lines and word lines serving as writing conductors, and a memory cell of a magnetoresistive element.

The layout of write conductors in the conventional MRAM is disclosed in, for example, Japanese Unexamined Patent Publication No. 2002-18239 (Patent Document 1). The layout of the write conductors disclosed in Patent Document 1 includes a first conductor having a first width, a second conductor having a second width, and a data storage layer. The first conductor and the second conductor are perpendicular to each other, and the data storage layer is positioned above the first conductor and below the second conductor at the intersection of the first conductor and the second conductor. The data storage layer has a first layer width and a second layer width. The first width of the first conductor is smaller than the first layer width of the data storage layer, and the second width of the second conductor is smaller than the second layer width of the data storage layer. In writing data in the data storage layer, current is allowed to flow through the first and second conductors, which generates a magnetic field to change the direction of magnetization of the data storage layer.

RELATED ART REFERENCES

Patent Documents

Patent Document 1

Japanese Unexamined Patent Publication No. 2002-118239

SUMMARY OF THE INVENTION

The conventional MRAM disadvantageously has reduced function of a magnetic memory element. For example, in the structure disclosed in Patent Document 1, the first conductor has asperities formed on an upper layer thereof due to the shape of the first conductor. The asperities adversely affect the flatness of the magnetic memory element (data storage layer), thus reducing the function of the magnetic memory element. In some cases, planarization of the upper layer of the magnetic memory element before formation of the second conductor may wrongly cut out the magnetic memory element, which leads to reduced function of the magnetic memory element.

Accordingly, it is an object of the present invention to provide a magnetic memory device that can suppress the reduction of function of a magnetic memory element, and a manufacturing method thereof.

A magnetic memory device according to one embodiment of the invention includes a magnetic memory element capable of holding data based on a magnetized state thereof, and first and second conductors capable of changing the magnetized state by a magnetic field generated. The magnetic memory element is disposed above the first conductor and below the second conductor at an intersection part of the first conductor extending in a first direction and the second conductor extending in a second direction. The first conductor has a first width at the intersection part in a direction perpendicular to the first direction as viewed planarly. The second conductor has a second width at the intersection part in a direction perpendicular to the second direction as viewed planarly. The magnetic memory element has a third width in the direction perpendicular to the first direction as viewed planarly, and a fourth width in the direction perpendicular to the second direction as viewed planarly. The first width is larger than the third width, and the second width is smaller than the fourth width.

A magnetic memory device according to another embodiment of the invention includes a magnetic memory element capable of holding data based on a magnetized state thereof, and first and second conductors capable of changing the magnetized state by a magnetic field generated. The magnetic memory element is disposed above the first conductor and below the second conductor at an intersection part of the first conductor extending in a first direction and the second conductor extending in a second direction. The magnetic memory element includes a magnetization fixed layer whose direction of magnetization is fixed, a magnetization free layer whose direction of magnetization is variable, and an intermediate layer provided between the magnetization fixed layer and the magnetization free layer. A distance from an upper surface of the first conductor to a lower surface of the intermediate layer is smaller than that from an upper surface of the intermediate layer to a lower surface of the second conductor.

A method for manufacturing a magnetic memory device according to one embodiment of the invention includes the following steps. A magnetic memory element is formed which is capable of holding data based on a magnetized state thereof. First and second conductors are formed which are capable of changing the magnetized state by a magnetic field generated. The magnetic memory element is disposed above the first conductor and below the second conductor at an intersection part of the first conductor extending in a first direction and the second conductor extending in a second direction. The first conductor has a first width at the intersection part in a direction perpendicular to the first direction as viewed planarly. The second conductor has a second width at the intersection part in a direction perpendicular to the second direction as viewed planarly. The magnetic memory element has a third width in the direction perpendicular to the first direction as viewed planarly, and a fourth width in the direction perpendicular to the second direction as viewed planarly. The first width is larger than the third width, and the second width is smaller than the fourth width.

A method for manufacturing a magnetic memory device according to another embodiment of the invention includes the following steps. A magnetic memory element is formed which is capable of holding data based on a magnetized state thereof. First and second conductors are formed which are capable of changing the magnetized state by a magnetic field generated. The magnetic memory element is disposed above the first conductor and below the second conductor at an intersection part of the first conductor extending in a first direction and the second conductor extending in a second direction. The step of forming the magnetic memory element includes a step of providing an intermediate layer between a magnetization fixed layer whose direction of magnetization is fixed, and a magnetization free layer whose direction of magnetization is variable. A distance from an upper surface of the first conductor to a lower surface of the intermediate layer is smaller than that from an upper surface of the intermediate layer to a lower surface of the second conductor.

The magnetic memory device and the manufacturing method thereof according to this and other embodiments of the invention can suppress the reduction of function of the magnetic memory element.

DETAILED DESCRIPTION OF THE PREFERRED EMBODIMENTS

Now, preferred embodiments of the invention will be described below based on the accompanying drawings. The term "lower" as used in this embodiment means a semiconductor substrate side. The term "upper" as used herein means a side opposite to the semiconductor substrate side (a bit line side).

Figure 1:
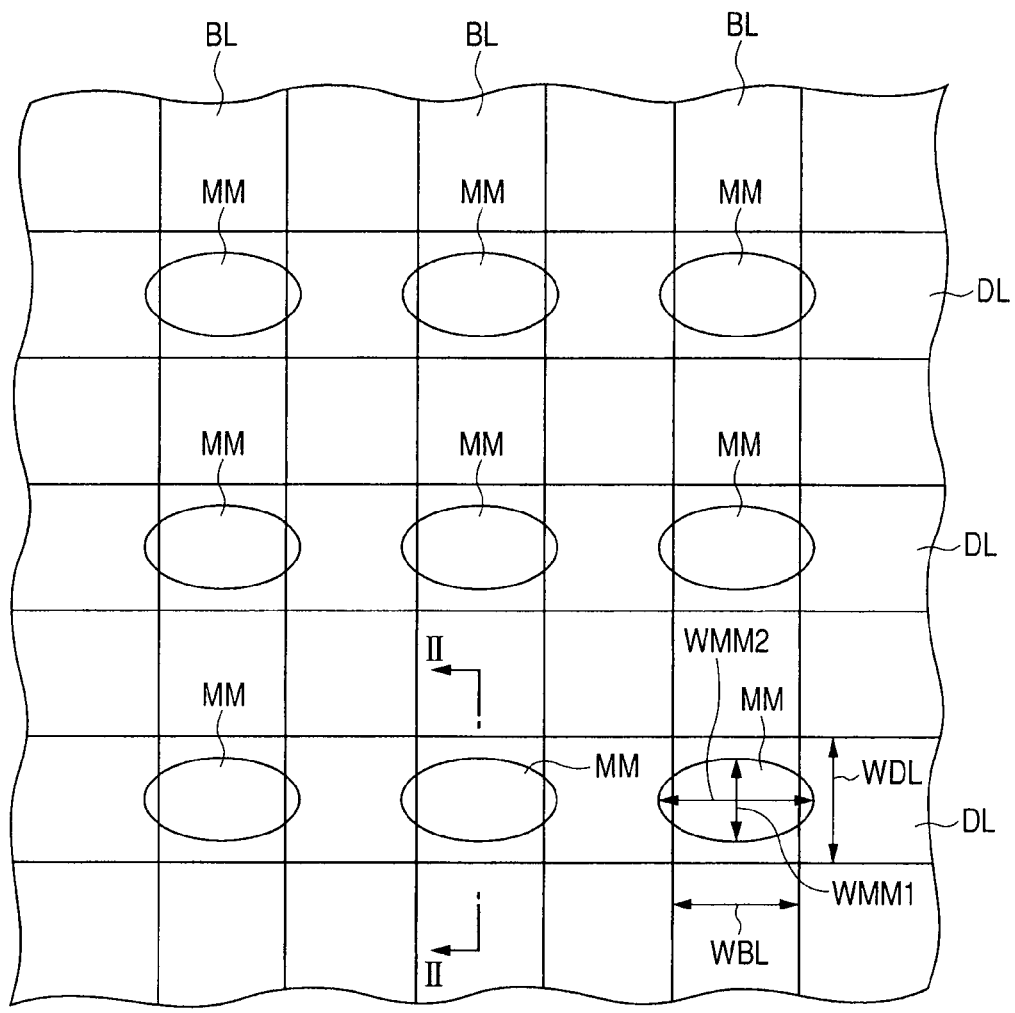
FIG. 1 is a schematic plan view showing the layout of a magnetic memory device according to one embodiment of the invention.

First, the planar layout of a magnetic memory device in the present embodiment will be described below using FIG. 1. FIG. 1 is a schematic plan view showing the layout of the magnetic memory device of one embodiment of the invention. Referring to FIG. 1, the magnetic memory device of this embodiment includes a plurality of digit lines DLs (first conductors), a plurality of bit lines BLs (second conductors), and a plurality of magnetic memory elements MMs. Each of the digit lines DLs extends in the lateral direction shown (first direction), and each of the bit lines BLs extends in the longitudinal direction shown (second direction). The digit line DL and the bit line BL are arranged, for example, perpendicular to each other. For example, a magnetic memory element MM having an elliptical shape as viewed planarly is arranged at each intersection part of the digit line DL and the bit line BL. Each magnetic memory element MM can hold data based on its magnetized state. Each of the digit lines DLs and bit lines BLs can change the magnetized state of the corresponding magnetic memory element MM by the magnetic field generated.

Next, the structure of a memory cell of the magnetic memory device of this embodiment will be described below using FIGS. 2 to 4.

Figure 2:
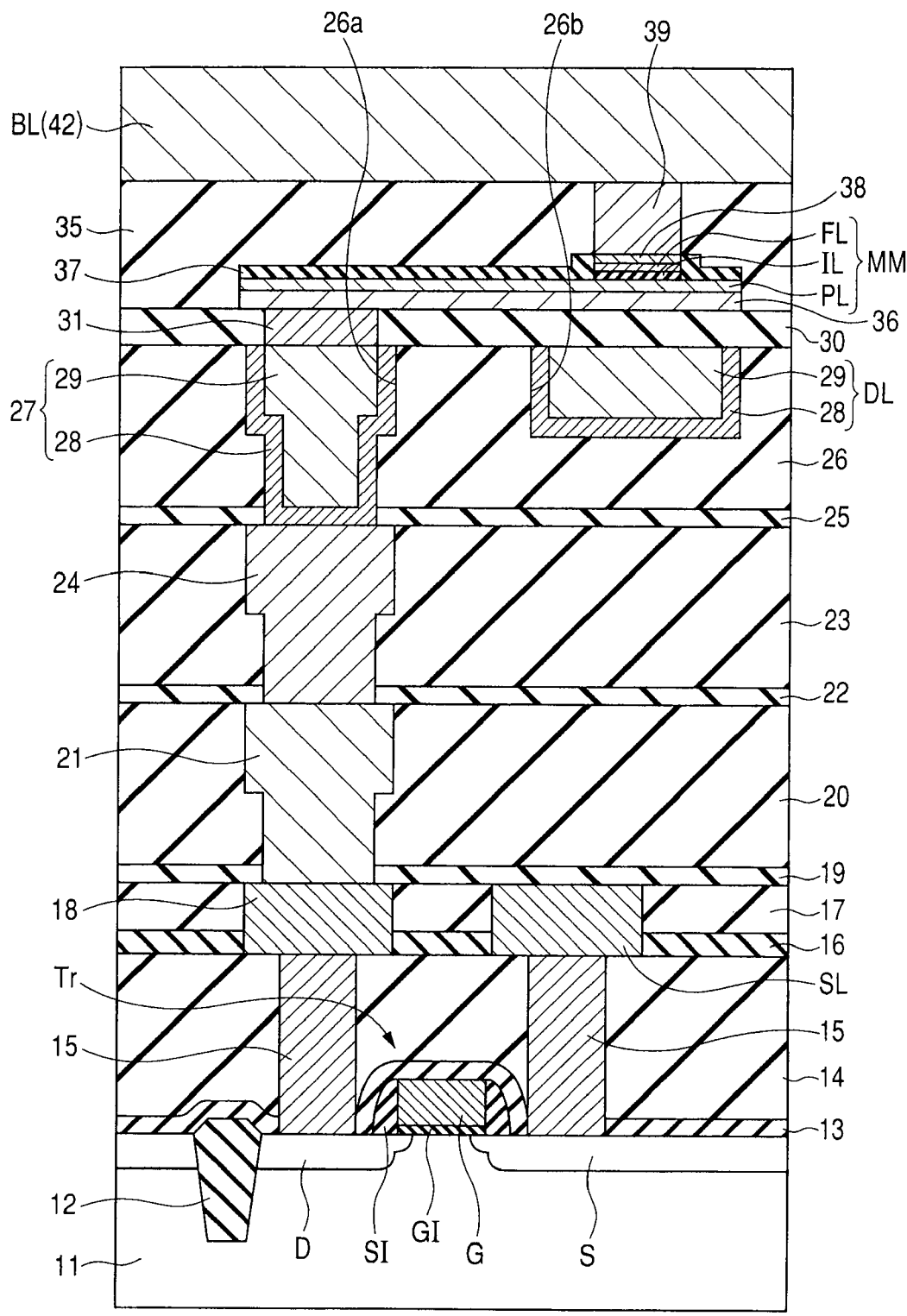
FIG. 2 is a schematic cross-sectional view taken along the line II-II of FIG. 1, showing the structure of a memory cell of the magnetic memory device in the embodiment of the invention.

FIG. 2 is a schematic cross-sectional view taken along the line II-II of FIG. 1, showing the structure of the memory cell of the magnetic memory device according to one embodiment of the invention. FIG. 3 is an enlarged cross-sectional view of an area around the magnetic memory element shown in FIG. 2. FIG. 4 is a cross-sectional view taken along the line IV-IV of FIG. 3.

In particular, referring to FIG. 2, in a memory cell region at a semiconductor substrate 11, a transistor Tr for element selection is formed at a surface of an element formation region (surface of the semiconductor substrate 11) partitioned by an element isolation insulating film 12. The transistor Tr for element selection mainly includes a drain region D, a source region S, and a gate electrode body G. The drain region D and the source region S are formed at the surface of the semiconductor substrate 11 with a predetermined interval therebetween. The drain region D and the source region S each are comprised of a region with impurities of a predetermined conductivity type. The gate electrode body G is formed over a region sandwiched between the drain region D and the source region S via a gate insulating film GI. The gate electrode body G has sidewalls covered with sidewall insulating films SIs.

Interlayer insulating films 13 and 14 are formed to cover the transistor Tr for element selection. Holes are provided in the interlayer insulating films 13 and 14 so as to respectively reach the drain region D and the source region S from an upper surface of the interlayer insulating film 14. Conductive layers 15 are formed in these holes. Interlayer insulating films 16 and 17 are formed over the interlayer insulating film 14. Holes are formed in the interlayer insulating films 16 and 17 so as to reach the respective conductive layers 15 from an upper surface of the interlayer insulating film 17. A conductive layer 18 is formed in the left hole shown in the figure among the holes, and a source line SL is formed in the right hole shown in the figure. Thus, the source line SL is electrically coupled to the source region S.

Interlayer insulating films 19 and 20 are formed over the interlayer insulating film 17 to cover the conductive layer 18 and the source line SL. A hole is provided in the interlayer insulating films 19 and 20 so as to reach from the upper surface of the interlayer insulating film 20. A conductive layer 21 is formed in the hole. Interlayer insulating films 22 and 23 are formed over the interlayer insulating film 20 so as to cover the conductive layer 21. A hole is provided in the interlayer insulating films 22 and 23 so as to reach the conductive layer 21 from the upper surface of the interlayer insulating film 23. A conductive layer 24 is formed in the hole.

Interlayer insulating films 25 and 26 are formed over the interlayer insulating film 23 to cover the conductive layer 24. The hole 26a is provided in the interlayer insulating films 25 and 26 so as to reach the conductive layer 24 from the upper surface of the interlayer insulating film 26. A conductive layer 27 is formed in the hole 26a. A slot 26b having a predetermined depth is formed in an upper part of the interlayer insulating film 26. A digit line DL is formed in the slot 26b. The conductive layer 27 and the digit line DL each have a conductive layer (clad layer) 28 and a conductive layer (conductor body) 29. The conductive layer 28 is formed at the bottom and sides of each of the hole 26a and the slot 26b. The conductive layer 29 is positioned above the conductive layer 28, and formed within each of the hole 26a and 26b. The conductive layer 28 is comprised of a magnetic material, such as NiFe alloy (permalloy), and has a function of suppressing the leakage of a magnetic field generated from current flowing through the conductive layer 29 into the outside. The conductive layer 28 with such a function is disposed in a part around the conductive layer 29 other than a part thereof on the magnetic memory element MM side rather than the conductive layer 29. When current is allowed to flow through the conductive layer 29 of the digit line DL, the magnetic field generated from the current in the direction of the magnetic memory element MM (upward in the figure) can be increased. The conductive layer 28 may be formed only in a part (for example, a side or a bottom) of the slot 26b. Alternatively, the conductive layer 28 may not be formed.

An interlayer insulating film 30 is formed over the interlayer insulating film 26 to cover the conductive layer 27 and the digit line DL. A hole is provided in the interlayer insulating film 30 to reach the conductive layer 27 from an upper surface thereof. A conductive layer 31 is formed in the hole.

Figure 3:
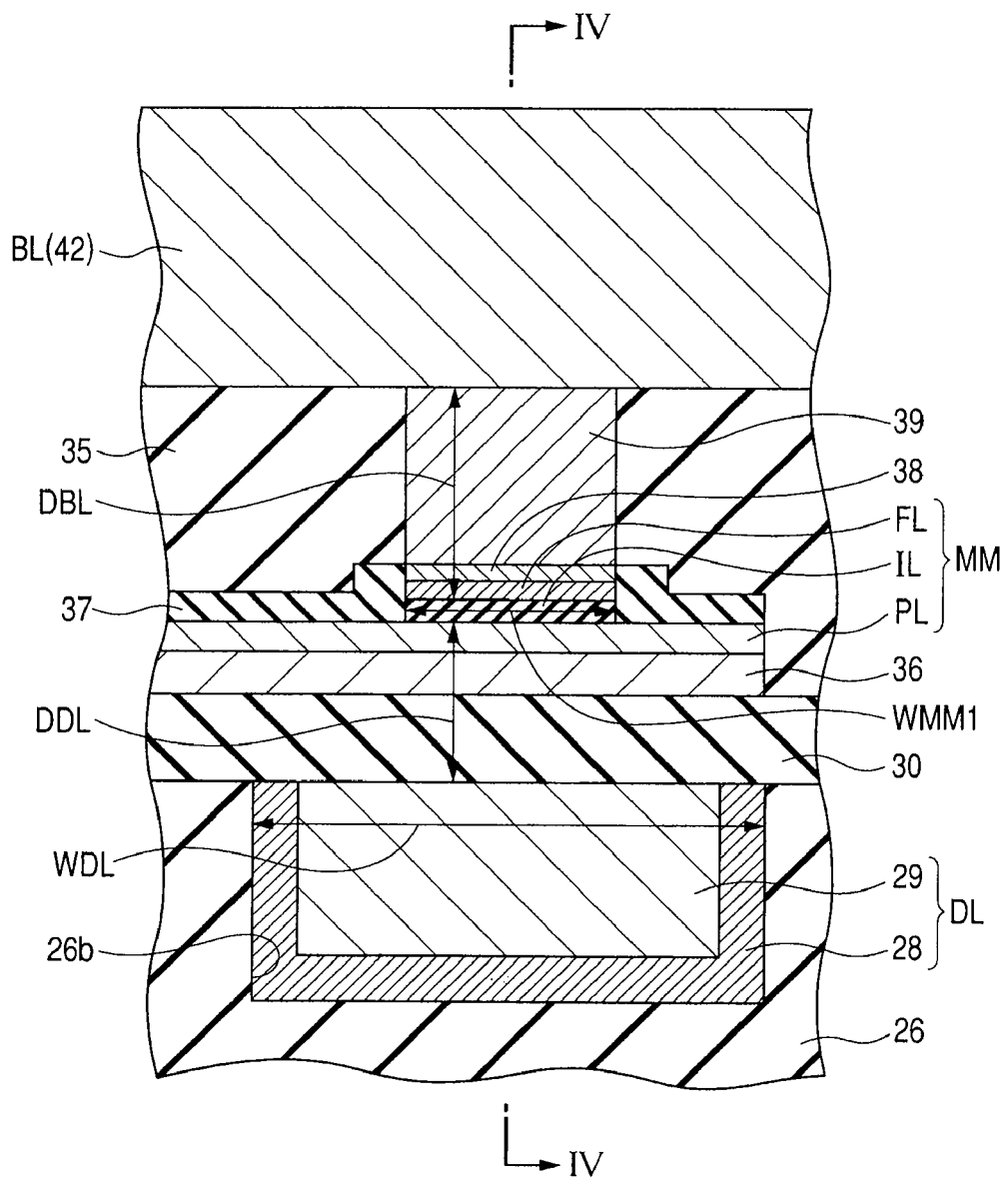
FIG. 3 is an enlarged cross-sectional view of an area around the magnetic memory element shown in FIG. 2.
Figure 4:
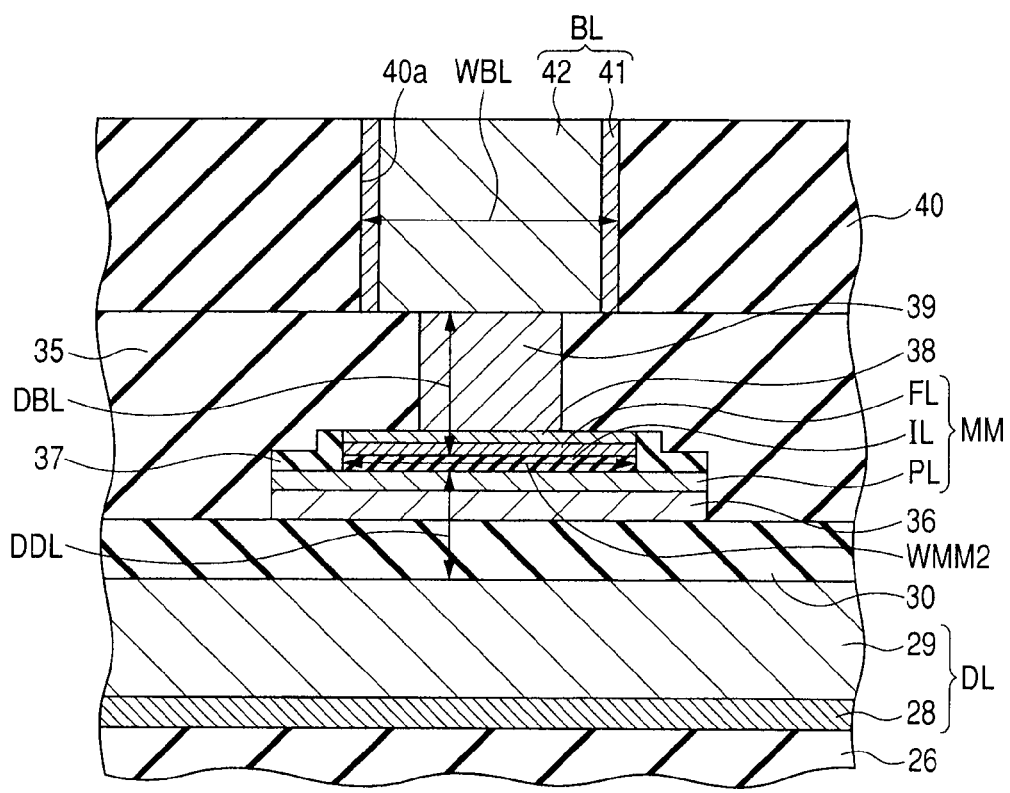
FIG. 4 is a cross-sectional view taken along the line IV-IV of FIG. 3.

In particular, referring to FIGS. 3 and 4, an electrode layer 36 is formed over the interlayer insulating film 30. The magnetic memory element MM is formed over an electrode layer 36. The magnetic memory element MM is, for example, a tunnel magnetoresistive element (TMR), and includes a magnetization fixed layer PL whose direction of magnetization is fixed, a magnetization free layer whose direction of magnetization is variable, and a tunnel insulating film IL (intermediate layer) provided between the magnetization fixed layer PL and the magnetization free layer FL. The magnetization fixed layer PL is formed over the electrode layer 36. The tunnel insulating film IL is formed over a part of the magnetization fixed layer PL. The magnetization free layer FL is formed over the tunnel insulating film IL. The magnetization fixed layer PL is electrically coupled to the drain region D via the electrode layer 36, the conductive layer 27, the conductive layer 24, the conductive layer 21, the conductive layer 18, and the conductive layer 15. The magnetization free layer FL may be formed over the electrode layer instead of the magnetization fixed layer PL, and the magnetization fixed layer PL may be formed over the tunnel insulating film IL instead of the magnetization free layer FL.

An electrode layer 38 is formed over the magnetic memory element MM. An insulating film 37 is formed in a region over the magnetization fixed layer PL without the tunnel insulating film IL, the magnetization free layer FL, and the electrode layer 38. An interlayer insulating film 35 is formed over the interlayer insulating film 30 and the insulating film 37 to cover the magnetic memory element MM. A hole is provided in the interlayer insulating film 35 so as to reach the electrode layer 38 from the upper surface thereof. A conductive layer 39 is formed in the hole.

In particular, referring to FIG. 4, an interlayer insulating film 40 is formed over the interlayer insulating film 35 to cover the insulating layer 39. A hole 40a is provided in the interlayer insulating film 40 so as to reach the conductive layer 39 from the upper surface of the insulating film 40. The bit line BL is formed in the hole 40a. The bit line BL includes a conductive layer (clad layer) 41, and a conductive layer (conductor body) 42. The conductive layer 41 is formed at the side of the hole 40a. The conductive layer 42 is formed within the hole 40a so as to be in contact with the conductive layer 41. The conductive layer 41 is comprised of a magnetic body, for example, a NiFe alloy (permalloy) and the like. The conductive layer 41 has a function of suppressing the leakage of a magnetic field generated from the current flowing through the conductive layer 42 into the outside, like the conductive layer 29. When current is allowed to flow through the conductive layer 42 of the bit line BL, the magnetic field generated from the current in the direction of the magnetic memory element MM (downward in the figure) can be increased. The conductive layer 41 may be formed at a part around the conductive layer 42 except for a part on the magnetic memory element MM side rather than the conductive layer 42. The conductive layer 41 may not be formed.

Referring to FIGS. 1 to 4, the magnetic memory element MM is disposed above the digit line DL and below the bit line BL. The digit line DL has a width WDL (first width) at the intersection part with the bit line BL in the direction (the longitudinal direction shown in the figure) perpendicular to an extending direction as viewed planarly. The bit line BL has a width WBL (second width) at the intersection part with the digit line DL in the direction (the lateral direction shown in FIG. 1) (the longitudinal direction shown in FIG. 1) perpendicular to an extending direction as viewed planarly. The magnetic memory element MM has a width WMM1 (third width) in the direction perpendicular to an extending direction of the digit wire as viewed planarly. Further, the magnetic memory element MM has a width WMM2 (fourth width) in the direction (the lateral direction shown in FIG. 1) perpendicular to an extending direction of the bit line BL as viewed planarly. The width WDL is larger than the width WMM1, and the width WBL is smaller than the width WMM2.

In particular, referring to FIGS. 3 and 4, a distance DDL between the upper surface of the digit line DL and the lower surface of the tunnel insulating film IL is smaller than a distance DBL from the upper surface of the tunnel insulating film IL and the lower surface of the bit line BL.

Next, the operation of a memory cell in the magnetic memory device of this embodiment will be described below. Referring to FIG. 2, in reading, predetermined current is allowed to flow through the magnetic memory element MM of a specific memory cell thereby to detect a difference in resistance due to the direction of magnetization. First, when a transistor Tr for element selection of the specific memory cell is turned ON, a predetermined sensed signal is transmitted from the bit line BL to the source line SL via the specific magnetic memory element MM, the electrode layer 36, the conductive layer 31, the conductive layer 27, the conductive layer 24, the conductive layer 21, the conductive layer 18, the conductive layer 15, the transistor Tr for element selection, and the conductive layer 15.

At this time, when the direction of magnetization of the magnetization fixed layer PL is the same (or parallel to) as that of the magnetization free layer FL in the magnetic memory element MM, the resistance of the MM becomes relatively low. When the direction of magnetization of the magnetization fixed layer PL is opposite (or unparallel) to that of the magnetization free layer FL in the magnetic memory element MM, the resistance of the MM becomes relatively high. As a result, when the magnetization direction of the magnetization fixed layer PL is parallel to that of the magnetization free layer FL, the tunnel current becomes large. When the magnetization direction of the magnetization fixed layer PL is unparallel to that of the magnetization free layer FL, the tunnel current becomes small.

Thus, when these magnetization directions at the magnetic memory element MM are in parallel to each other, the strength of the sensed signal flowing through the source line SL becomes larger than the strength of a signal of a predetermined reference memory cell. In contrast, when the magnetization directions at the magnetic memory element MM are nonparallel to each other, the strength of the sensed signal becomes smaller than that of a signal of the predetermined reference memory cell. In this way, whether the strength of the sensed signal is larger or smaller than that of the signal of the predetermined reference memory cell determines whether the information written in a specific memory cell is "0" or "1".

In writing (rewriting), predetermined current is allowed to flow through the bit line BL and the digit line DL, so that the magnetic memory element MM undergoes magnetization (magnetization reversal). First, the predetermined current is allowed to flow through each of the bit line BL and digit line DL selected to generate a magnetic field corresponding to each of directions of currents flowing around the bit line BL and digit line DL. A combined magnetic field is provided by a combination of a magnetic field generated by current flowing through the bit line BL and a magnetic field generated by current flowing through the digit line DL, and applied to the magnetic memory element MM positioned at an area of intersection between the bit line BL and the digit line DL selected.

At this time, the combined magnetic field may cause the following forms: a form in which the magnetization free layer FL of the magnetic memory element MM is magnetized in the same direction as that of the magnetization fixed layer PL, and a form in which the magnetization free layer FL is magnetized in the direction opposite to that of the magnetization fixed layer PL. In this way, the invention achieves the case where the magnetization fixed layer PL and the magnetization free layer FL have the same magnetization direction (in parallel), and the case where the fixed layer PL and the free layer FL have opposite (nonparallel) magnetization directions to each other. Each of the cases is recorded as information corresponding to "0" or "1" of the magnetization direction.

Figure 5:
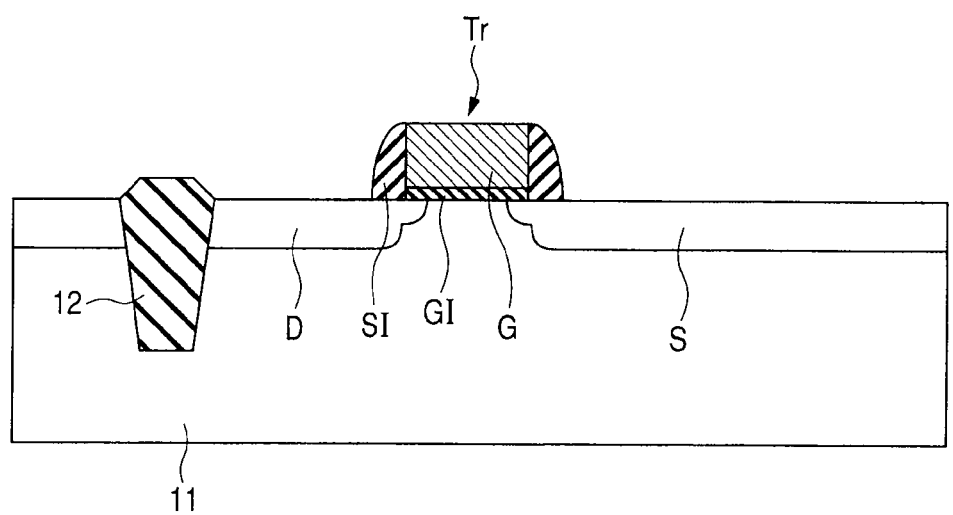
FIG. 5 is a schematic cross-sectional view showing a first step of a manufacturing method of the magnetic memory device in the embodiment of the invention.

Now, one example of a manufacturing method of the magnetic memory device in this embodiment will be described below. FIGS. 5 to 18 are schematic cross-sectional views sequentially showing steps of the manufacturing method of the magnetic memory device in one embodiment of the invention. Referring to FIG. 5, the element isolation insulating film 12 is formed in a predetermined region at a main surface of the semiconductor substrate 11 thereby to form a memory cell region. Then, the gate electrode body G is formed at the surface of the semiconductor substrate 11 positioned in the memory cell region via the gate insulating film GI. Impurities of a predetermined conductivity type are introduced into the surface of the semiconductor substrate 11 using the gate electrode body G as a mask to form the drain region D and the source region S comprised of impurity regions. Then, an insulating layer is formed over the semiconductor substrate 11 to cover the gate electrode body G, and then etched back, so that the sidewall insulating film SI is formed at each of the sides of the gate electrode body G. Thus, the transistor Tr for element selection is formed at the surface of the semiconductor substrate 11 in the memory cell region.

Figure 6:
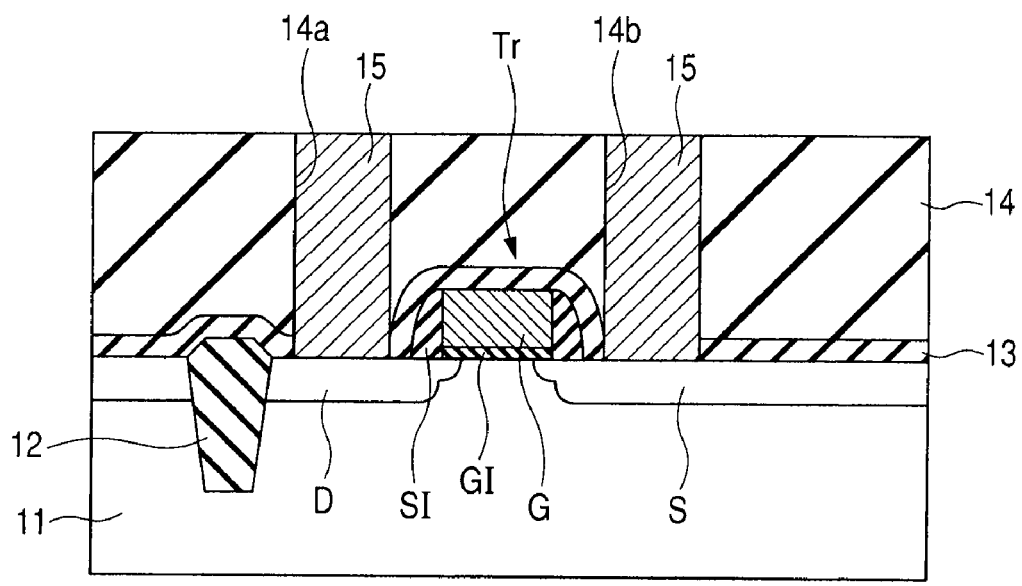
FIG. 6 is a schematic cross-sectional view of a second step of the manufacturing method of the magnetic memory device in the embodiment of the invention.

Referring to FIG. 6, the interlayer insulating films 13 and 14 are formed, for example, by a chemical vapor deposition (CVD) method to cover the transistor Tr for element selection. Predetermined photoengraving and etching is applied to the interlayer insulating films 13 and 14, so that holes 14a and 14b are formed to expose the surface of the semiconductor substrate 11. A conductive layer is formed over the interlayer insulating film 14 to fill the holes 14a and 14b. The conductive layer is subjected to the chemical mechanical polishing (CMP) process thereby to remove a part of the conductive layer positioned over the upper surface of the interlayer insulating film 13. As a result, the conductive layer 15 is formed in each of the holes 14a and 14b.

Figure 7:
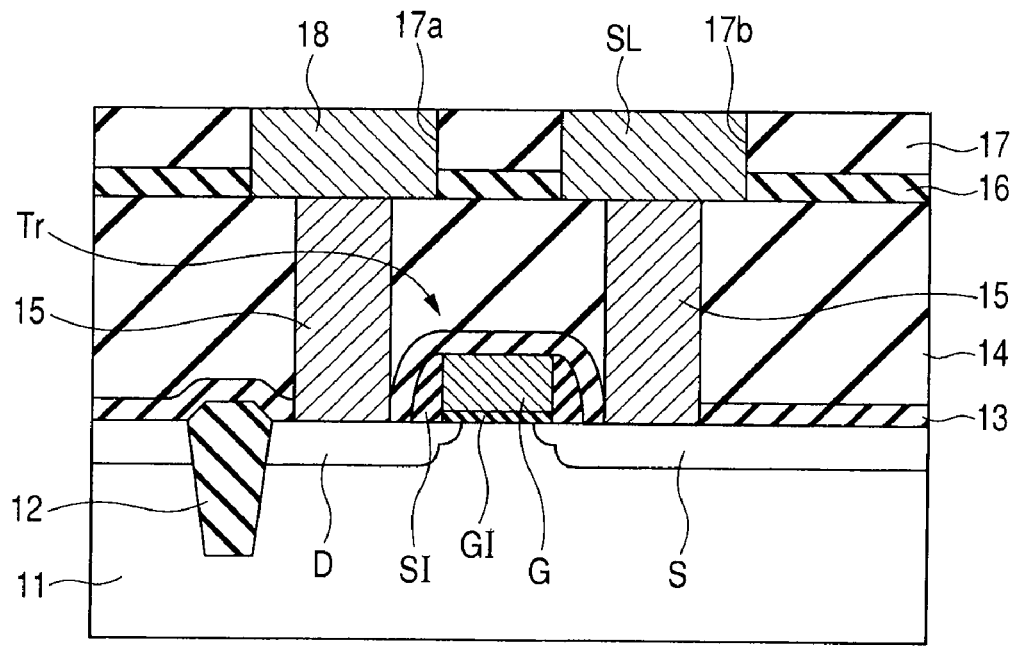
FIG. 7 is a schematic cross-sectional view of a third step of the manufacturing method of the magnetic memory device in the embodiment of the invention.

Referring to FIG. 7, the interlayer insulating films 16 and 17 are formed over the interlayer insulating film 14, for example, by the CVD method to cover the two conductive layers 15. The predetermined photoengraving and etching is applied to the interlayer insulating films 16 and 17, which forms holes 17a and 17b reaching the two conductive layers 15. In the holes 17a and 17b, the conductive layer 18 and the source line SL are formed of copper by, for example, plating.

Figure 8:
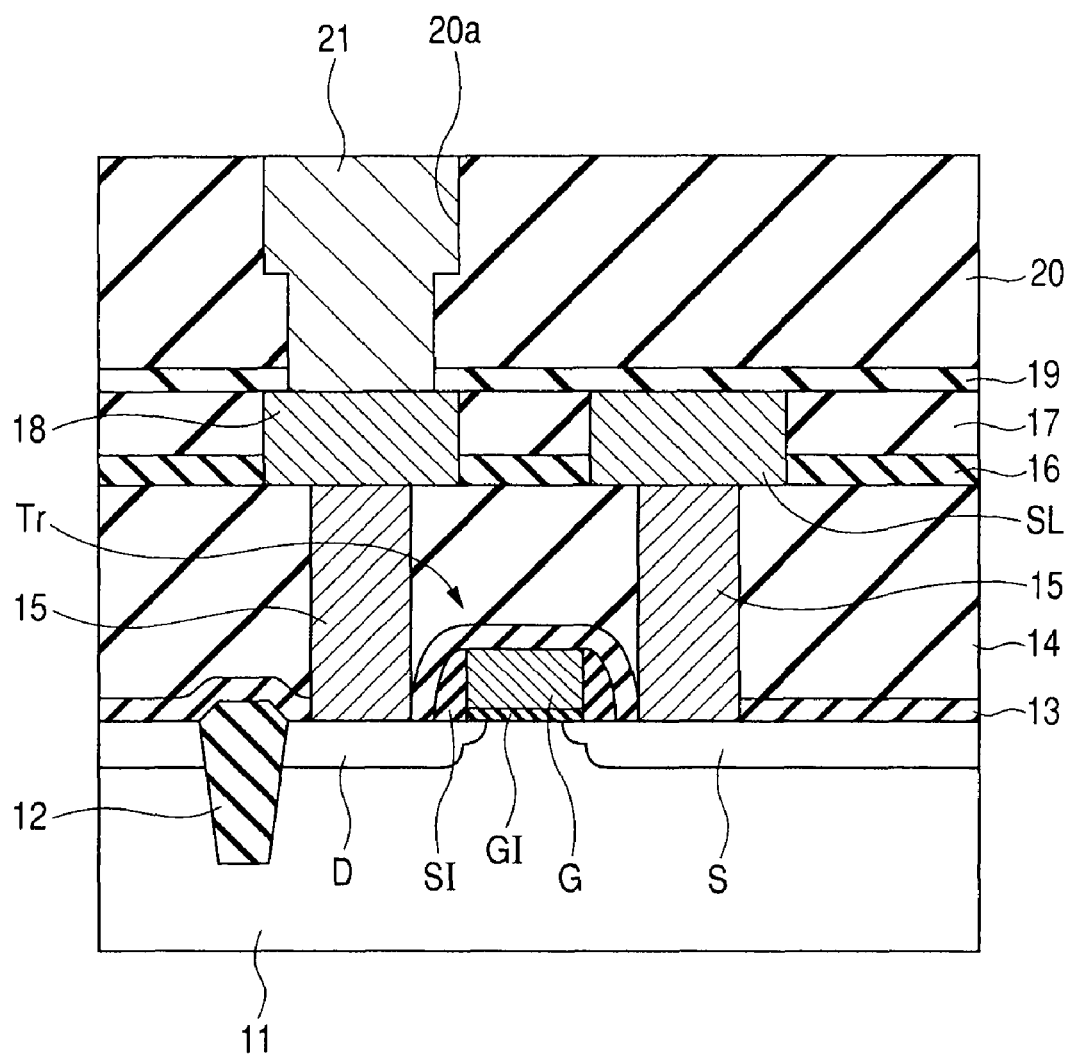
FIG. 8 is a schematic cross-sectional view of a fourth step of the manufacturing method of the magnetic memory device in the embodiment of the invention.

Referring to FIG. 8, interlayer insulating films 19 and 20 are formed over the interlayer insulating film 17, for example, by the CVD method to cover the conductive layer 18 and the source line SL. The predetermined photoengraving and etching is applied to the interlayer insulating films 19 and 20 to form a hole 20a reaching the conductive layer 18. A conductive layer 21 is formed of copper by, for example, plating, in the hole 20a.

Figure 9:
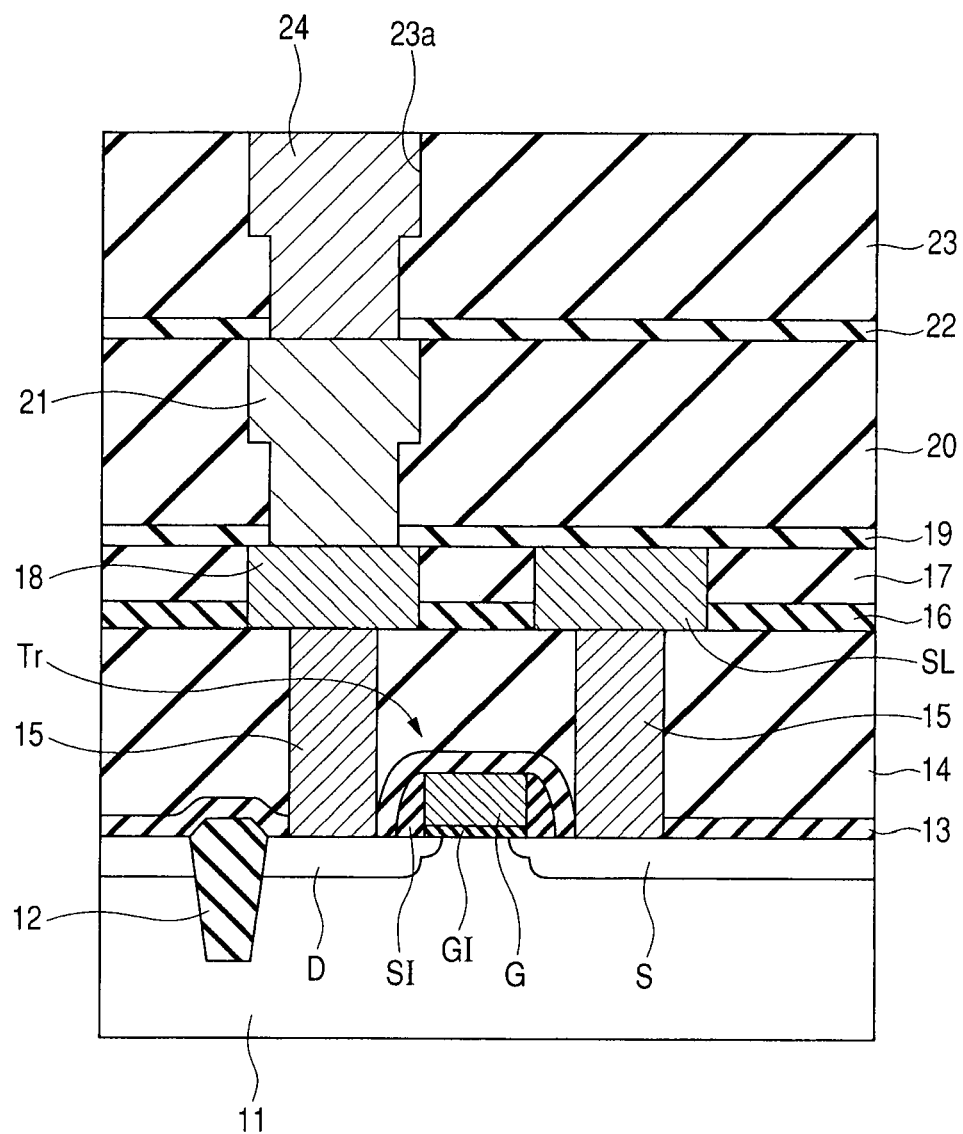
FIG. 9 is a schematic cross-sectional view of a fifth step of the manufacturing method of the magnetic memory device in the embodiment of the invention.

Referring to FIG. 9, interlayer insulating films 22 and 23 are formed over the interlayer insulating film 20, for example, by the CVD method to cover the conductive layer 21. The predetermined photoengraving and etching is applied to the interlayer insulating films 22 and 23 to form a hole 23a reaching the conductive layer 21. A conductive layer 24 is formed of copper by, for example, plating, in the hole 23a.

Figure 10:
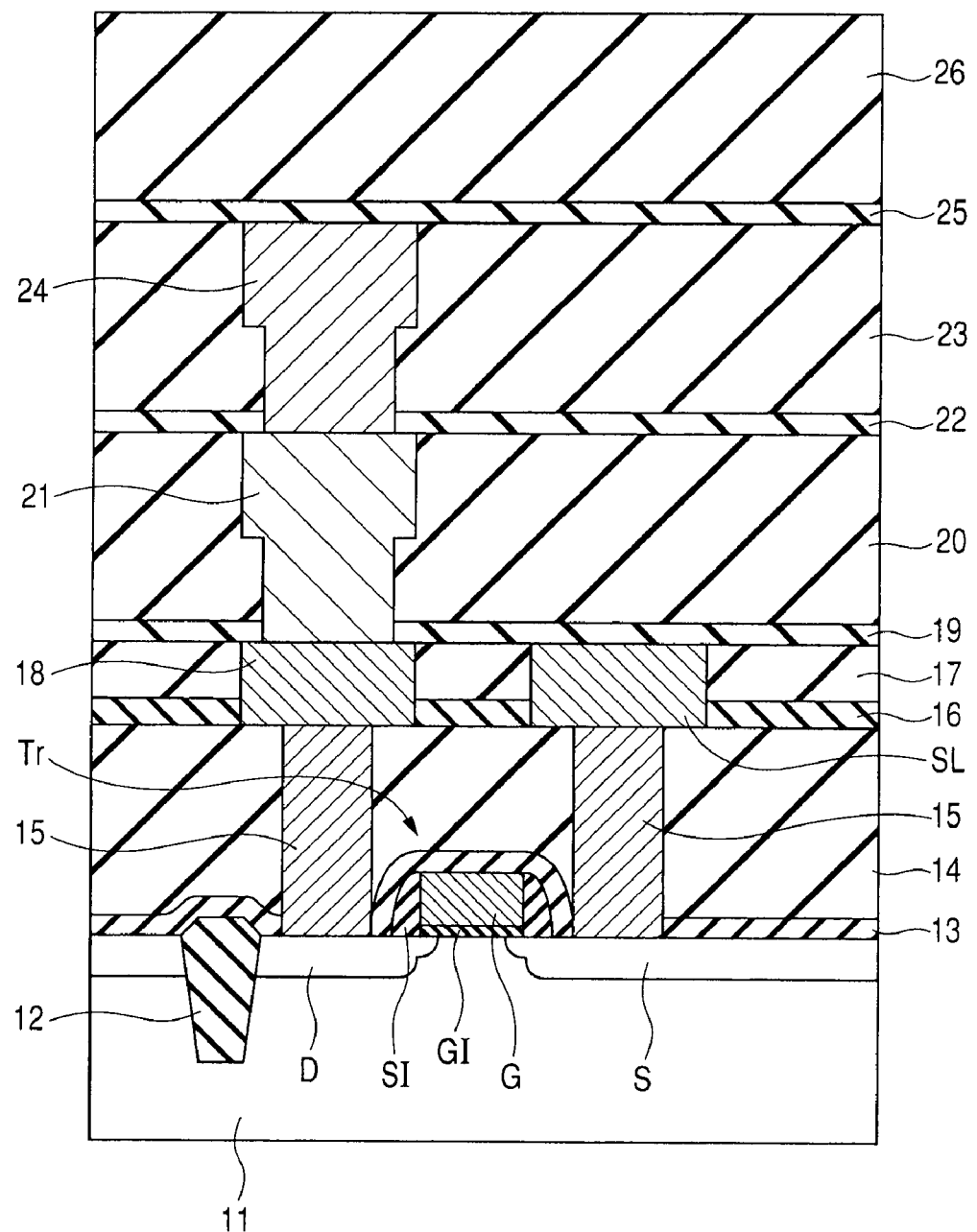
FIG. 10 is a schematic cross-sectional view of a sixth step of the manufacturing method of the magnetic memory device in the embodiment of the invention.

Referring to FIG. 10, the interlayer insulating films 25 and 26 are formed over the interlayer insulating film 23, for example, by the CVD method, to cover the conductive layer 24.

Figure 11:
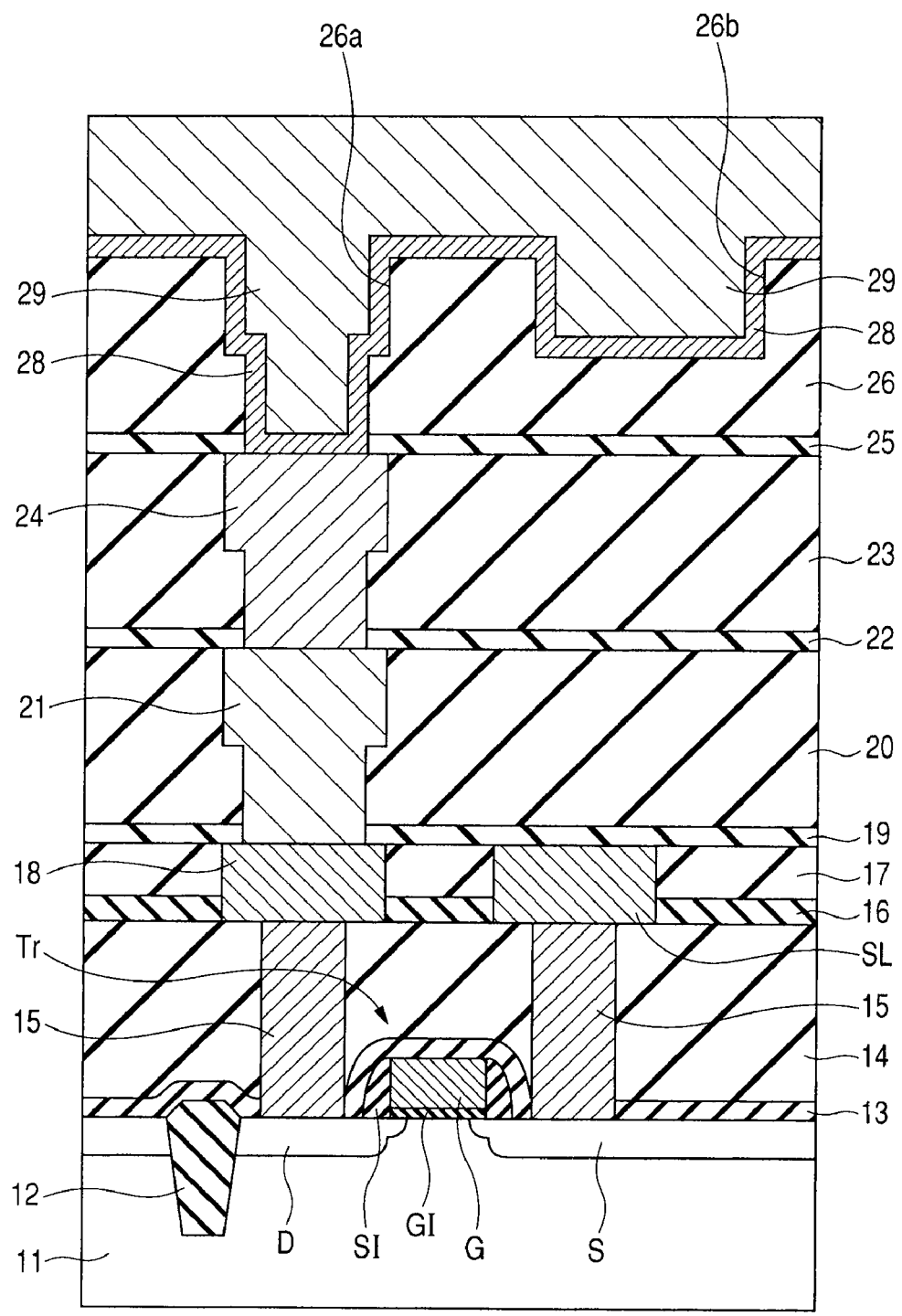
FIG. 11 is a schematic cross-sectional view of a seventh step of the manufacturing method of the magnetic memory device in the embodiment of the invention.

Referring to FIG. 11, the predetermined photoengraving and etching is applied to the interlayer insulating films 25 and 26 to form the hole 26a reaching the conductive layer 24. The slot 26b having the predetermined depth is formed above the interlayer insulating film 26. In forming the slot 26b, the slot 26b has a width corresponding to a width WDL (see FIG. 3) of the digit line DL. Then, the conductive layer (clad layer) 28 is formed over the sides and bottom of each of the hole 26a and the slot 26b, and over the interlayer insulating film 26, for example, by sputtering. A conductive layer (conductor body) 29 is formed over the conductive layer 28, for example, by plating.

Figure 12:
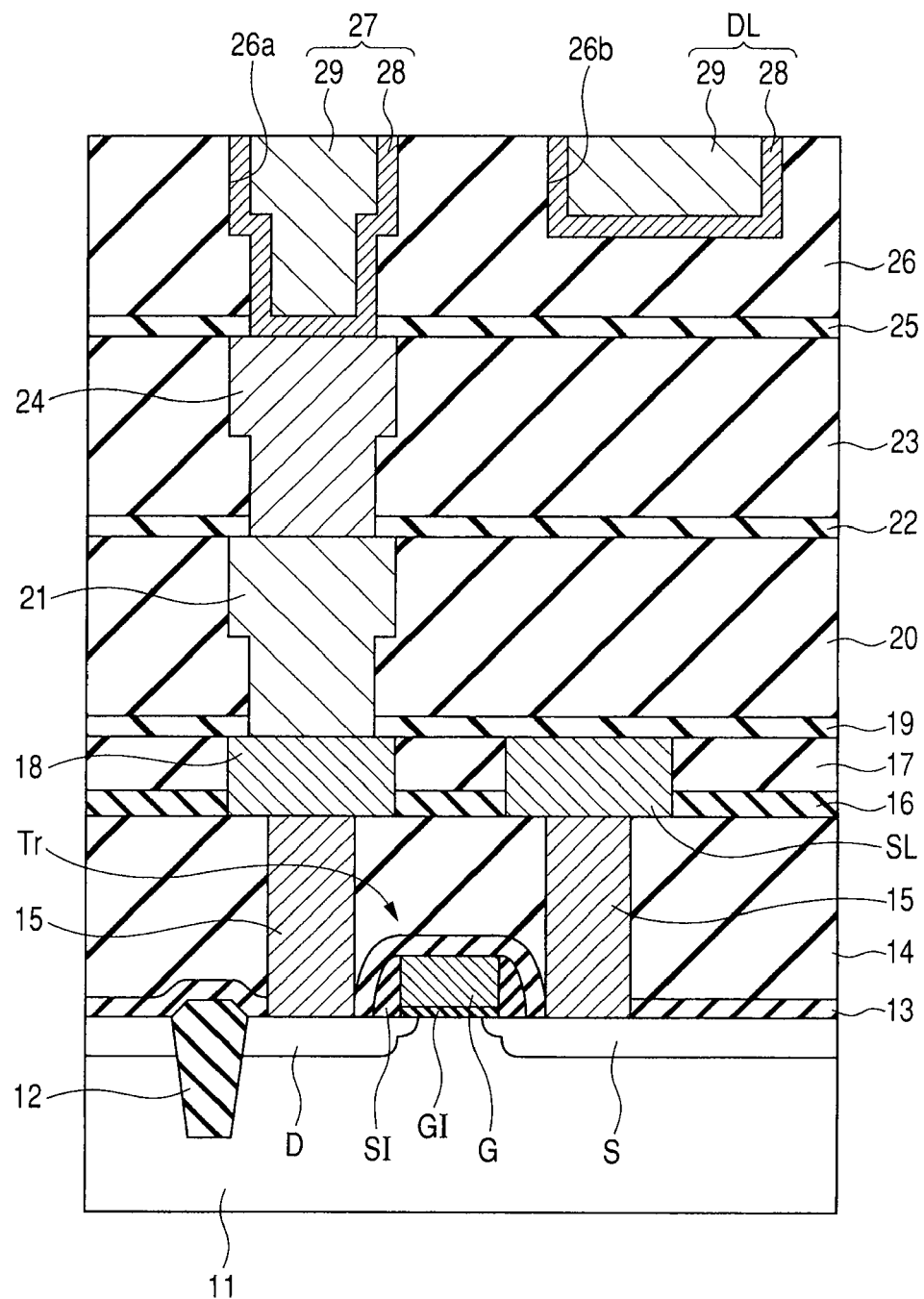
FIG. 12 is a schematic cross-sectional view of an eighth step of the manufacturing method of the magnetic memory device in the embodiment of the invention.

Referring to FIG. 12, a planarization process (for example, a CMP process) is applied to the conductive layers 28 and 29 thereby to remove parts of the conductive layers 28 and 29 located on the upper surface of the interlayer insulating film 26. As a result, the conductive layer 27 is formed in the hole 26a, and the digit line DL (first conductor) is formed in the slot 26b.

Figure 13:
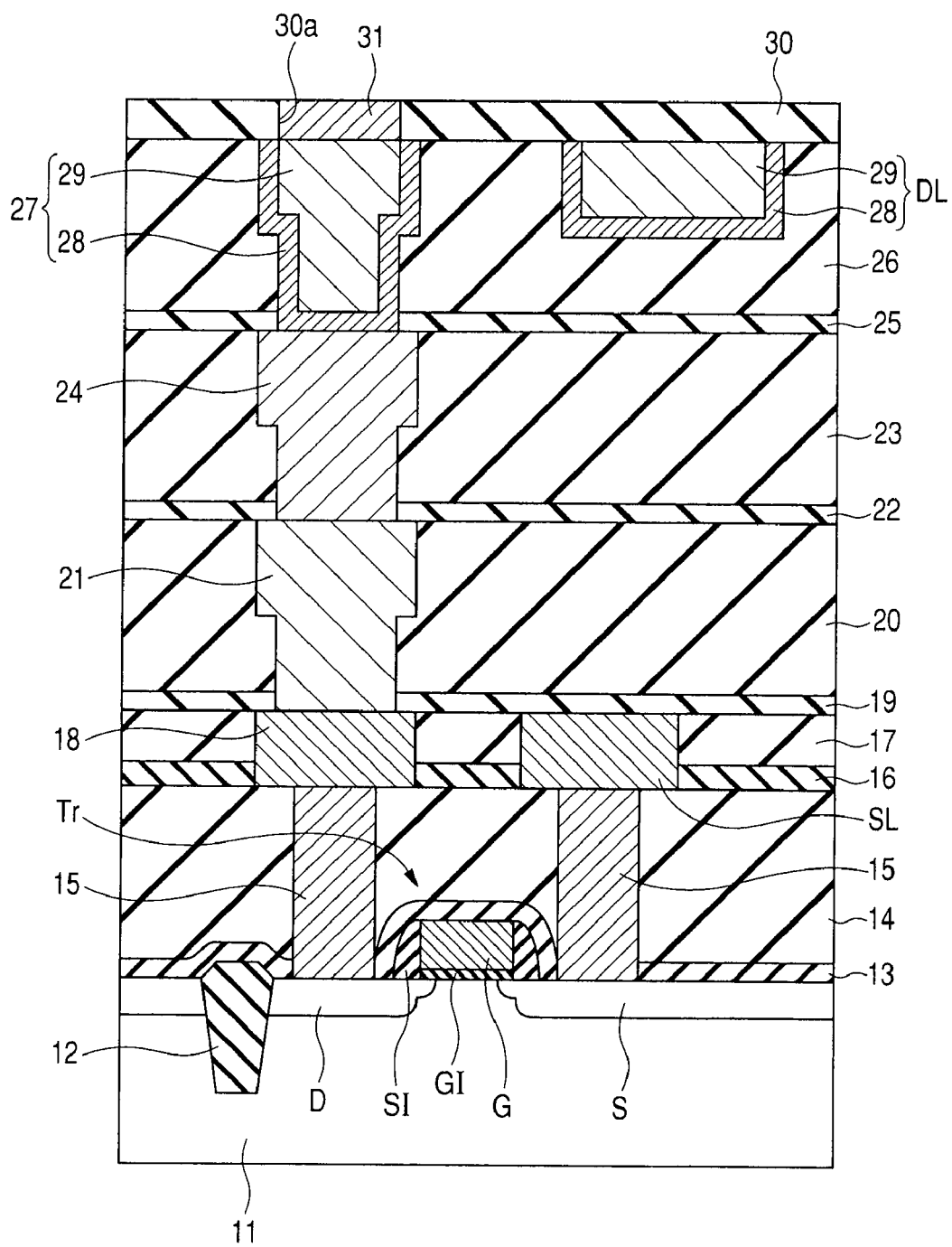
FIG. 13 is a schematic cross-sectional view of a ninth step of the manufacturing method of the magnetic memory device in the embodiment of the invention.

Referring to FIG. 13, the interlayer insulating film 30 is formed over the interlayer insulating film 26, for example, by the CVD method, to cover the conductive layer 27 and the digit line DL. The predetermined photoengraving and etching is applied to the interlayer insulating film 30 to form the hole 30a reaching the conductive layer 27. The conductive layer 31 is formed in the hole 30a, for example, by the CVD method.

Figure 14:
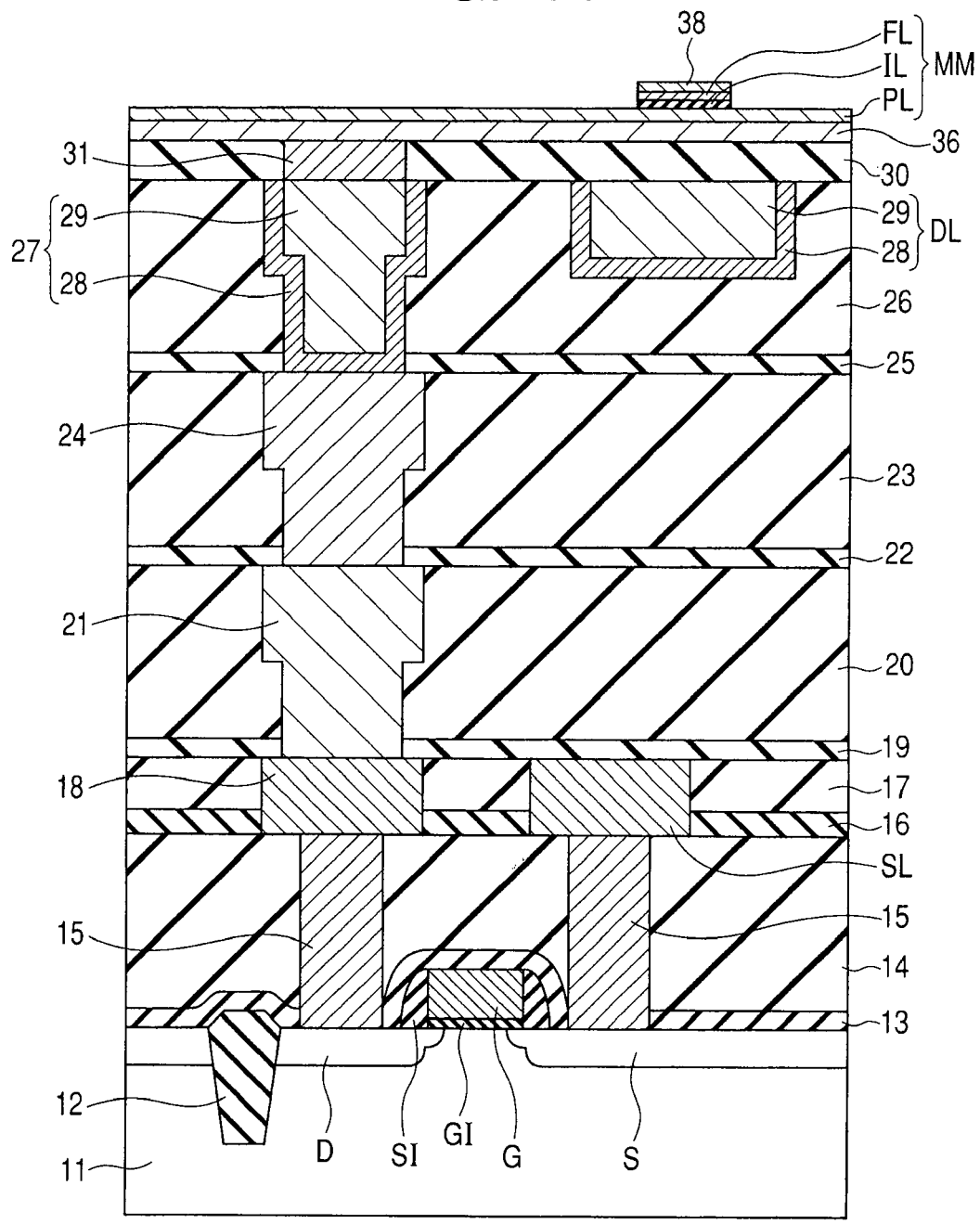
FIG. 14 is a schematic cross-sectional view of a tenth step of the manufacturing method of the magnetic memory device in the embodiment of the invention.

Referring to FIG. 14, the electrode layer 36, the magnetization fixed layer PL, the tunnel insulating film IL (intermediate layer), the magnetization free layer FL, and the electrode layer 38 are formed over the interlayer insulating film 30, for example, by sputtering, to cover the conductive layer 31. In forming the interlayer insulating film 30, the electrode layer 36, and the magnetization fixed layer PL, the thickness of a combination of the interlayer insulating film 30, the electrode layer 36, and the fixed layer PL corresponds to the thickness represented by a distance DDL (see FIG. 3). Then, the predetermined photoengraving and etching is applied to perform patterning of the tunnel insulating film IL, the magnetization free layer FL, and the electrode layer 38. In the patterning, the width of each of the tunnel insulating film IL, the magnetization free layer FL, and the electrode layer 38 is defined as the width WMM1 (see FIG. 3) and the width MM2 (see FIG. 4) of the magnetic memory element MM. Thus, the magnetic memory element MM is obtained.

Figure 15:
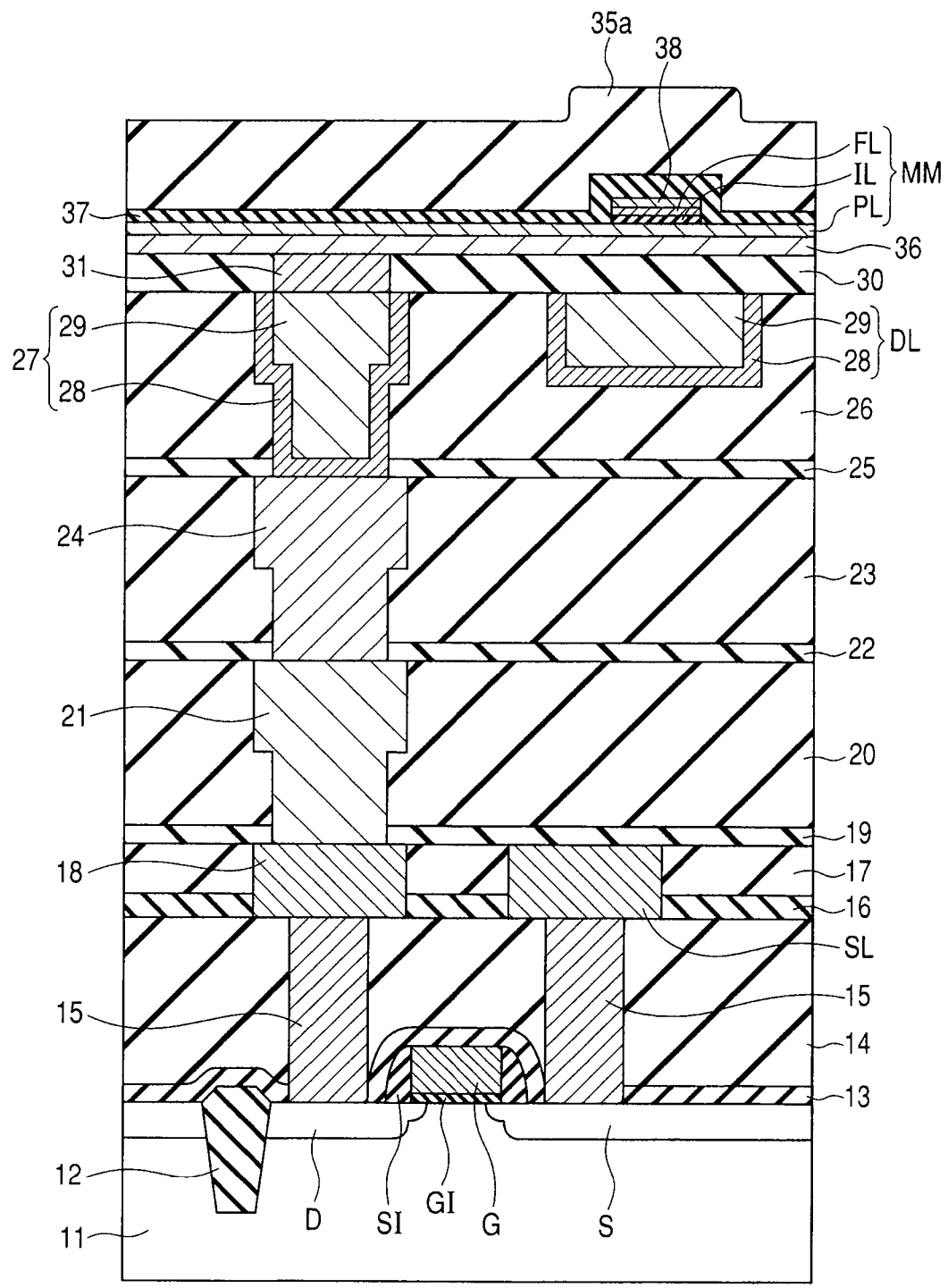
FIG. 15 is a schematic cross-sectional view of an eleventh step of the manufacturing method of the magnetic memory device in the embodiment of the invention.

Referring to FIG. 15, the insulating film 37 and an insulating film 35a are formed over the magnetization fixed layer PL, for example, by the CVD method, to cover the electrode layer 38.

Figure 16:
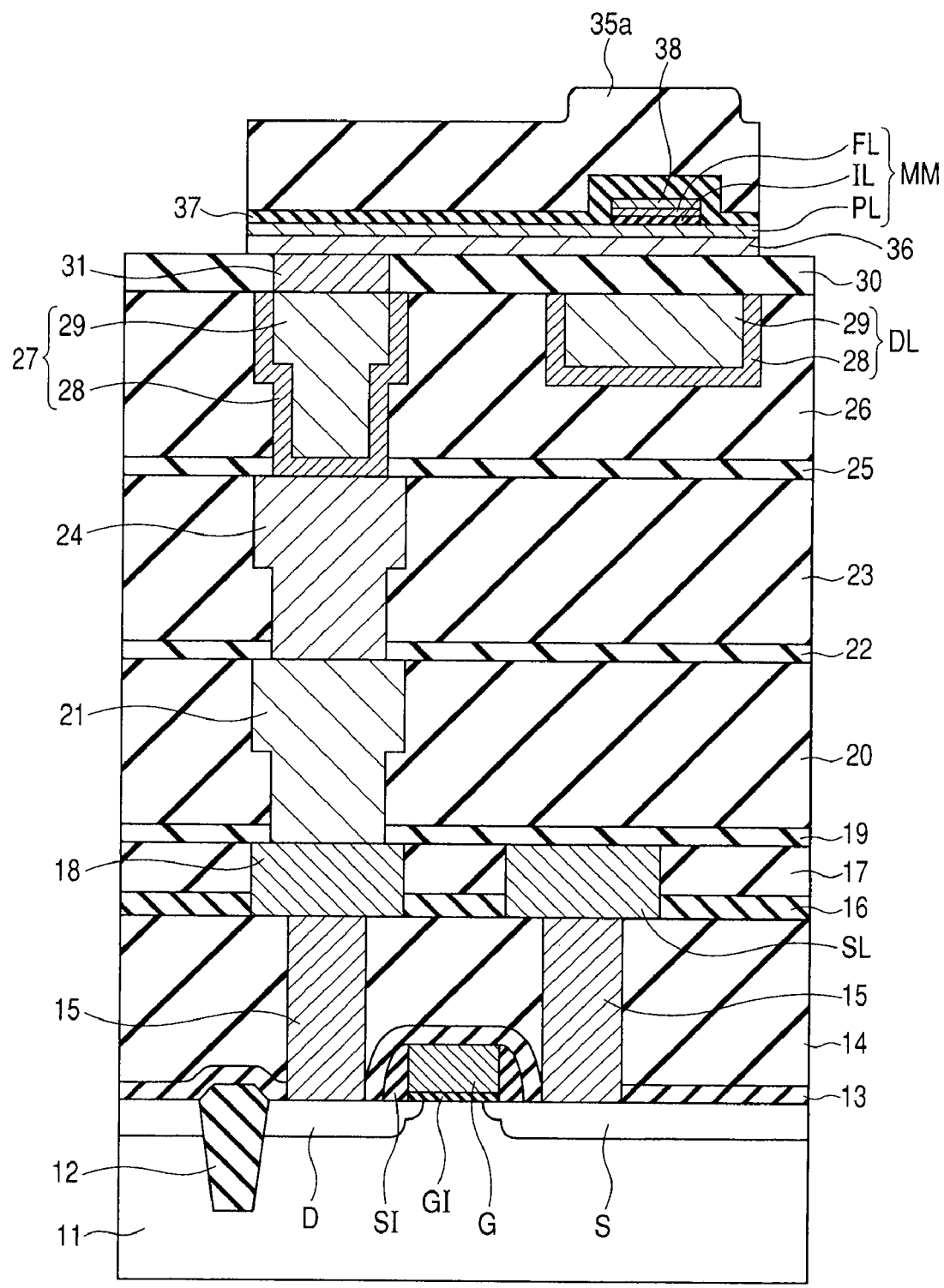
FIG. 16 is a schematic cross-sectional view of a twelfth step of the manufacturing method of the magnetic memory device in the embodiment of the invention.

Referring to FIG. 16, the predetermined photoengraving and etching is applied to perform patterning of the insulating film 35a, the insulating film 37, the magnetization fixed layer PL, and the electrode layer 36. As a result, a part of the interlayer insulating film 30 is exposed.

Figure 17:
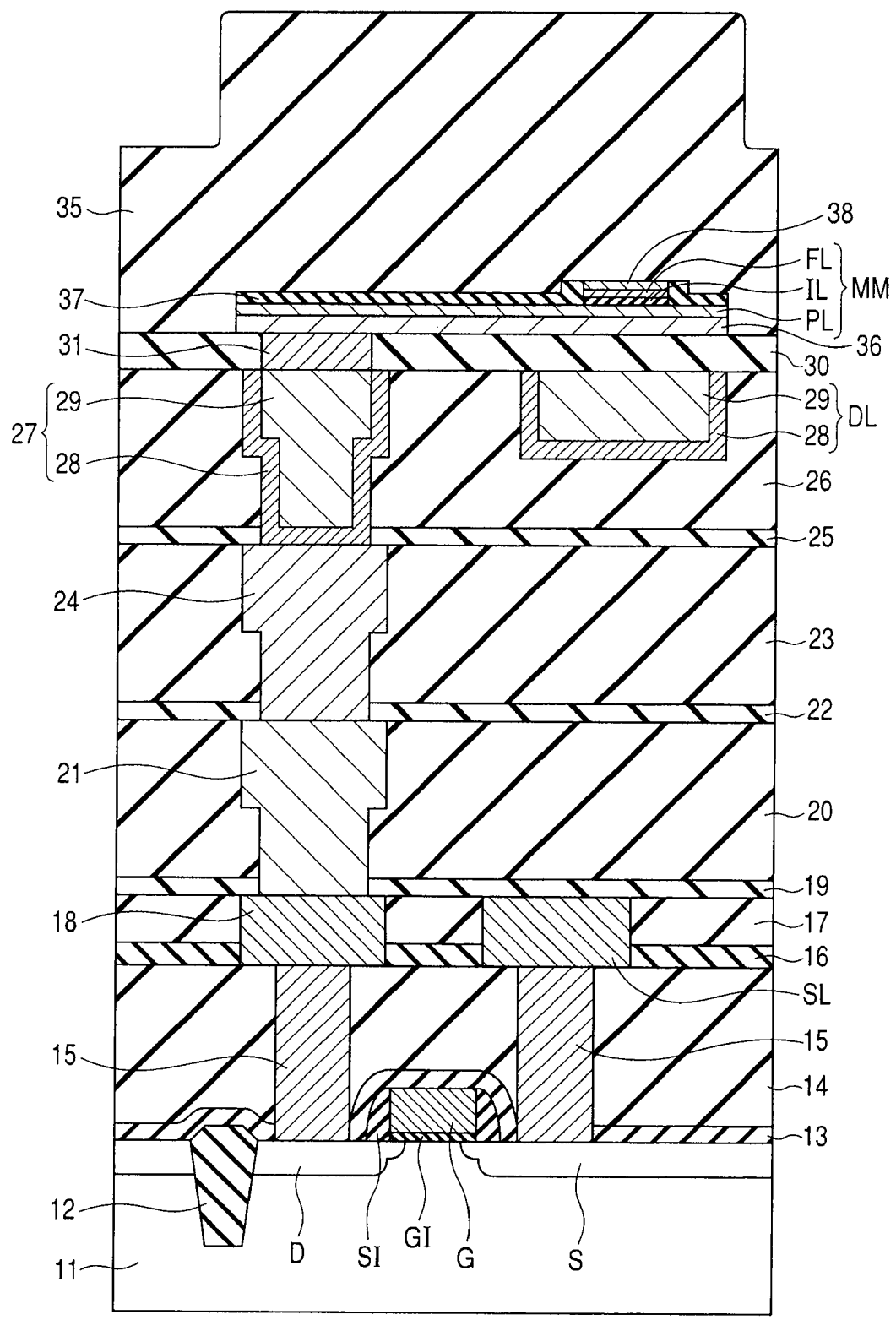
FIG. 17 is a schematic cross-sectional view of a thirteenth step of the manufacturing method of the magnetic memory device in the embodiment of the invention.

As shown in FIG. 17, an insulating film comprised of the same material as the insulating film 35a is formed over the interlayer insulating film 30, for example, by the CVD method, to cover the insulating film 35a. As a result, the insulating film 35a forms the interlayer insulating film 35 together with the insulating film newly formed.

Figure 18:
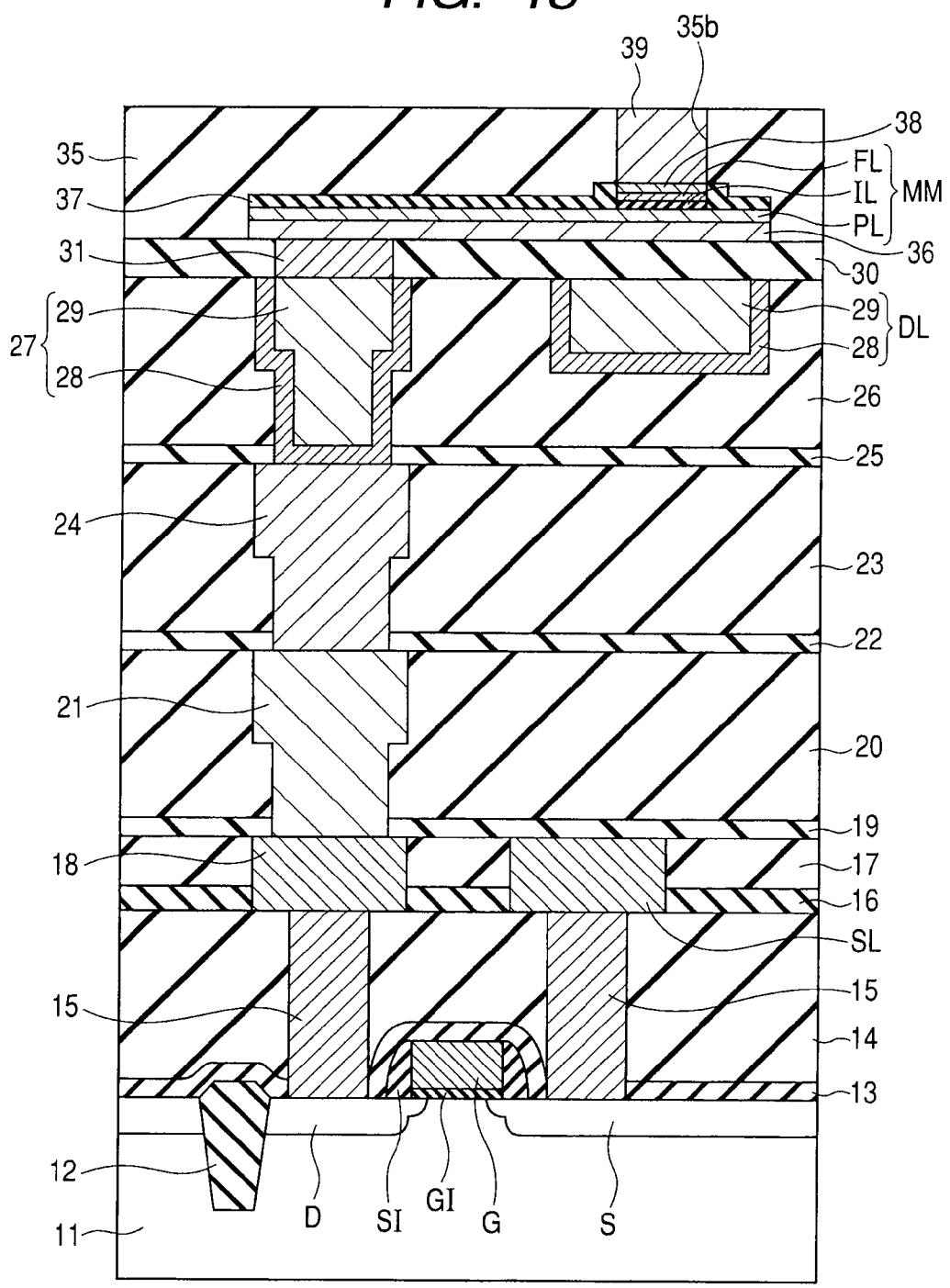
FIG. 18 is a schematic cross-sectional view of a fourteenth step of the manufacturing method of the magnetic memory device in the embodiment of the invention.

Referring to FIG. 18, the CMP process is applied to the interlayer insulating film 35 to planarize an upper surface of the interlayer insulating film 13. In the planarization process, the thickness of a combination of the magnetization free layer FL, the electrode layer 38, and the interlayer insulating film 35 over the electrode layer 38 corresponds to the thickness represented by a distance DBL (see FIG. 4). Next, the predetermined photoengraving and etching is applied to the interlayer insulating film 35 to form the hole 35b reaching the electrode layer 38. The conductive layer 39 is formed of copper in the hole 35b, for example, by the CVD method.

Returning now to FIGS. 2 to 4, the interlayer insulating film 40 is formed over the interlayer insulating film 35, for example, by sputtering, to cover the conductive layer 39. The predetermined photoengraving and etching is applied to the interlayer insulating film 35 to form a hole 40a reaching the conductive layer 39. The conductive layer (clad layer) 41 is formed on the sides and bottom of the hole 40a and the interlayer insulating film 35, for example, by sputtering. The predetermined photoengraving and etching is applied to the conductive layer 41 thereby to remove parts of the conductive layer 41 other than the part of the layer 41 located on the side of the hole 41a. Then, the conductive layer (conductor body) 42 is formed over the interlayer insulating film 40, for example, by plating to fill the hole 40a. The CMP process is applied to the conductive layer 42 thereby to remove parts of the conductive layer 42 positioned on the upper surface of the interlayer insulating film 40. As a result, the bit line BL (second conductor) is formed in the hole 40a. By the following steps, the magnetic memory device of this embodiment has been completed.

In the magnetic memory device of this embodiment, metal, such as tungsten, silicon, copper, titanium, or tantalum, may be used as a conductor layer. Further, an alloy or a nitride of these metals may be used. Particularly, in using copper as the conductive layer, the so-called damascene process may be applied, so that a wiring layer can be formed in parallel to the conductive layer. Further, the dual damascene process can be applied. Wirings in use, including a source line, a bit line, and a digit line, may be comprised of metal, such as silicon, tungsten, aluminum, titanium, an alloy or a compound of such metals.

The tunnel insulating film IL in use may include non-magnetic material, such as aluminum oxide. Alternatively, the tunnel insulating film IL in use may be an oxide of metal, such as aluminum, silicon, tantalum, or magnesium, a nitride of the metal, an alloy oxide of the metal, typified by silicate, or a nitride of the alloy. The use of non-magnetic metal material instead of the tunnel insulating film IL may make a giant magnetoresistance (GMR) element as the magnetic memory element MM.

Tetra ethyl ortho silicate (TEOS), $SiO_2$, or SiN may be used as the interlayer insulating film.

The magnetization fixed layer PL and the magnetization free layer FL each preferably include ferromagnetic material, containing nickel, iron, and/or cobalt, as a principal component. In order to achieve the improvement of magnetic characteristics and the thermal stability of the ferromagnetic material, an additive, such as boron, nitrogen, silicon, or molybdenum, may be introduced into the ferromagnetic material. The improvement of the magnetic characteristics and the stability of the magnetization fixed layer PL can be achieved by laminating on the magnetization fixed layer PL, a crystalline material thin film having a crystal structure of a body-centered cubic type, a rutile type, a sodium chloride type, or a zinc blende type which can improve the magnetic characteristics of the magnetization fixed layer PL, and/or by laminating an oxidization preventing film made of tantalum or ruthenium. Further, the magnetization fixed layer PL and the magnetization free layer FL in use may include, for example, NiMnSb called as a half-metal, $Co_2Mn(Ge, Si)$, $Co_2Fe(Al, Si)$, $(Zn, Mn)Fe_2O_4$, and the like. In the halfmetals, an energy gap exists in one spin band, which can provide a very large magnetic effect, resulting in a large output of signal. As an example of a combination of the magnetization fixed layer PL and the magnetization free layer FL, for example, a lamination of a platinum-manganese alloy film and a cobalt-iron alloy film may be used for the magnetization fixed layer PL, and a nickel iron alloy film may be used for the magnetization free layer FL.

Although in this embodiment the magnetic memory element is comprised of the magnetization fixed layer as a single layer and the magnetization free layer as another single layer, the magnetic memory element may be comprised of two or more magnetization fixed layers and two or more magnetization free layers. In this structure, a film corresponding to the tunnel insulating film serves as an intermediate layer of the invention.

Further, in this embodiment, the second conductor (bit line) is used for reading from the magnetic memory element. However, the first and second conductors have only to change the magnetized state of at least the magnetic memory element, and thus a conductor other than the second conductor may be used for reading from the magnetic memory element.

Now, the operations and effects of the magnetic memory device and the manufacturing method thereof in this embodiment will be described below.

In the magnetic memory device and the manufacturing method of this embodiment, the width WDL of the digit line DL is larger than the width WMM1 of the magnetic memory element MM, and the width WBL of the bit line BL is smaller than the width WMM2 of the magnetic memory element MM, which can suppress the reduction of function of the magnetic memory element MM. This mechanism will be described below.

Figure 19:
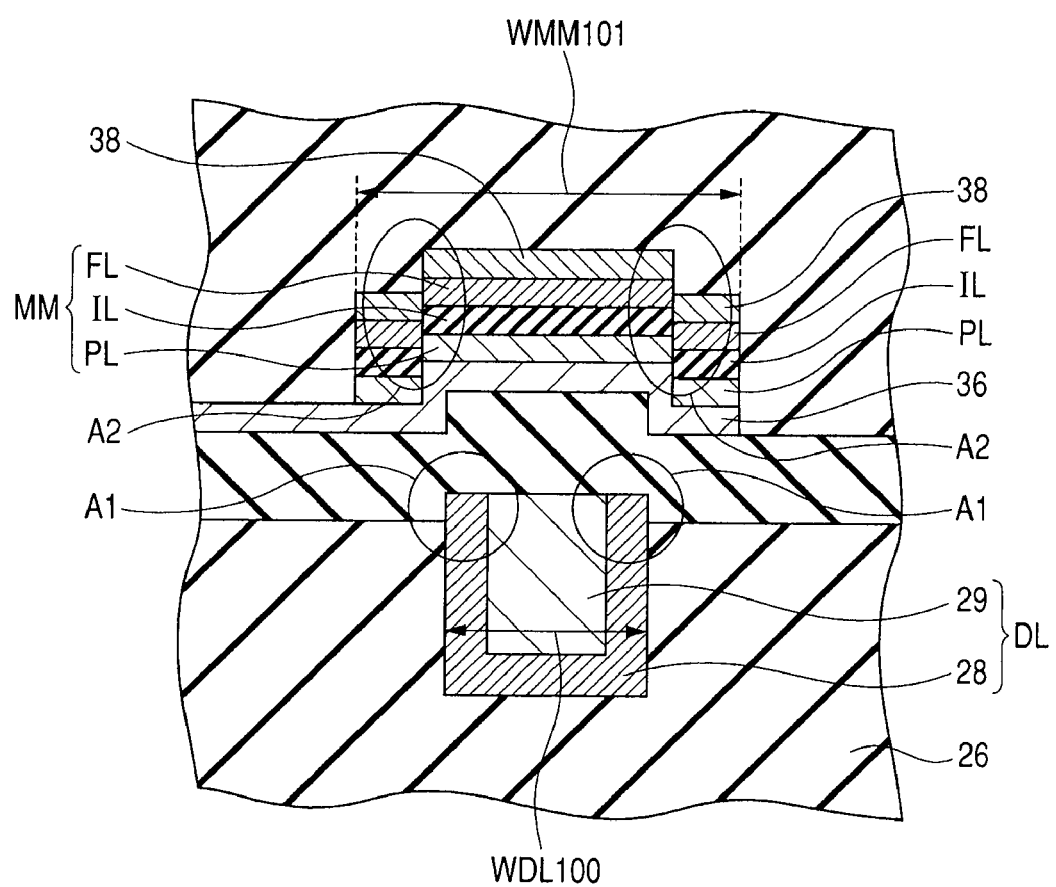
FIG. 19 is a schematic cross-sectional view for explaining one problem when a width of a digit line is equal to or less than that of a magnetic memory element as one comparative example of the invention.
Figure 20:
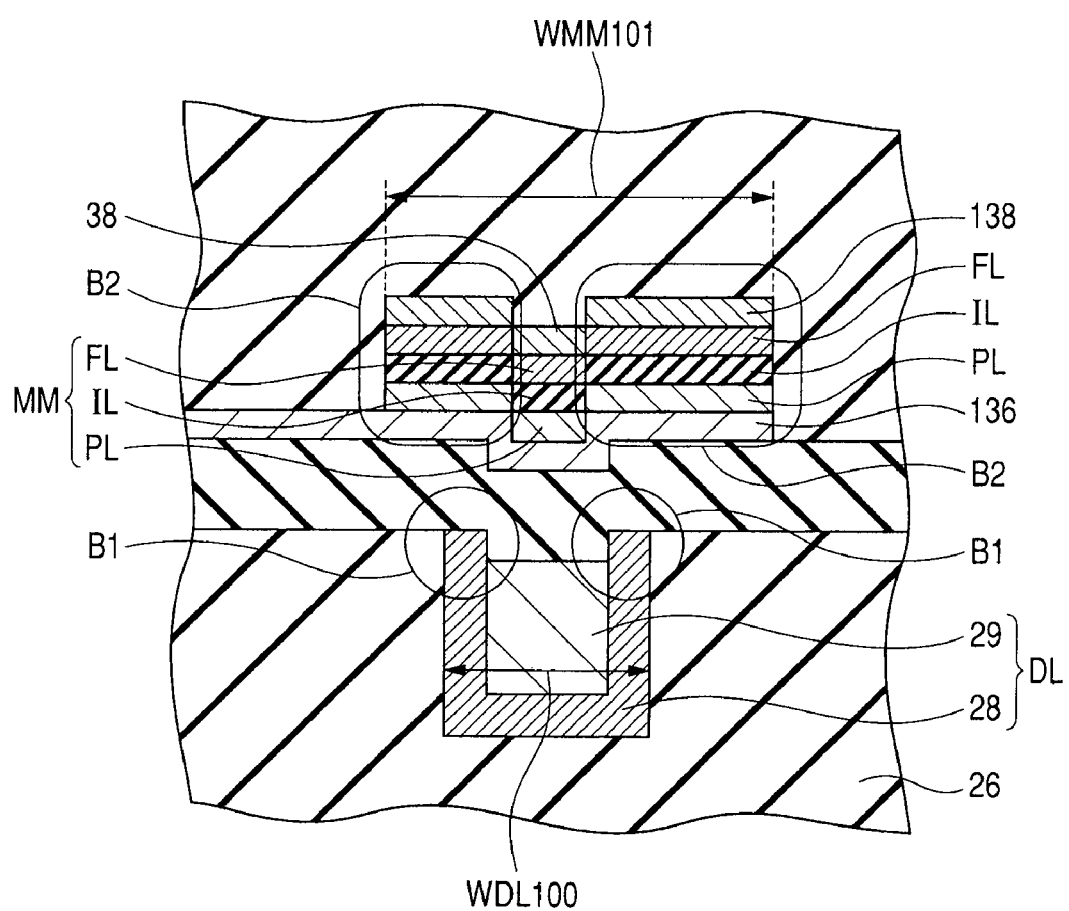
FIG. 20 is a schematic cross-sectional view for explaining another problem when the width of the digit line is equal to or less than that of the magnetic memory element as another comparative example of the invention.

FIGS. 19 and 20 are schematic cross-sectional views showing the structure of a memory cell of a magnetic memory device as a comparative example of the invention when the width of a digit line is equal to or less than the width of the magnetic memory element. Referring to FIG. 19, when performing the planarization process on the conductive layers 28 and 29 shown in FIG. 12, a stepped portion A1 based on the shape of the digit line DL may be generated between the upper surface of the digit line DL and the upper surface of the interlayer insulating film 26 due to a difference in etching speed between the conductive layers 28 and 29 and the interlayer insulating film 26. When the width WDL100 of the digit line DL (corresponding to the width WDL shown in FIG. 3) is smaller than the width WMM101 of the magnetic memory element MM (corresponding to the width WMM shown in FIG. 3), the magnetic memory element MM is formed directly above the stepped portion A1, so that a stepped portion A2 is also formed at the magnetic memory element MM. As a result, the magnetic domain of the magnetization fixed layer does not continue to the magnetic domain of the magnetization free layer due to the stepped portion A2 in the magnetic memory element MM, which reduces a single-domain part between the magnetization fixed layer and the magnetization free layer. Thus, the function of the magnetic memory element MM is reduced.

With reference to FIG. 19, when performing the planarization process on the conductive layers 28 and 29 show in FIG. 12, a stepped portion B1 based on the shape of the digit line DL may be generated between the upper surface of the conductive layer 28 and the upper surface of the conductive layer 29 due to a difference in etching speed between the conductive layers 28 and 29. When the width WDL100 of the digit line DL is smaller than the width WMM101 of the magnetic memory element MM, the magnetic memory element MM is formed directly above the stepped portion A1, so that a stepped portion B2 is also formed at the magnetic memory element MM. As a result, the magnetic domain of the magnetization fixed layer does not continue to the magnetic domain of the magnetization free layer due to the stepped portion B2 in the magnetic memory element MM, which reduces a single-domain part between the magnetization fixed layer and the magnetization free layer. Thus, the function of the magnetic memory element MM is reduced.

In contrast, as shown in FIG. 3, in the magnetic memory device of this embodiment, the width WDL of the digit line DL is larger than the width WMM1 of the magnetic memory element MM. Thus, even if the stepped portion A1 shown in FIG. 18 or the stepped portion B1 shown in FIG. 19 is generated, the magnetic memory element MM is hardly positioned directly above the stepped portion A1 or stepped portion B1. This makes it difficult to generate a stepped portion at the magnetic memory element, which can suppress the reduction in area of the single-domain part between the magnetization fixed layer and the magnetization free layer. As a result, the reduction of function of the magnetic memory element can be suppressed.

Figure 21:
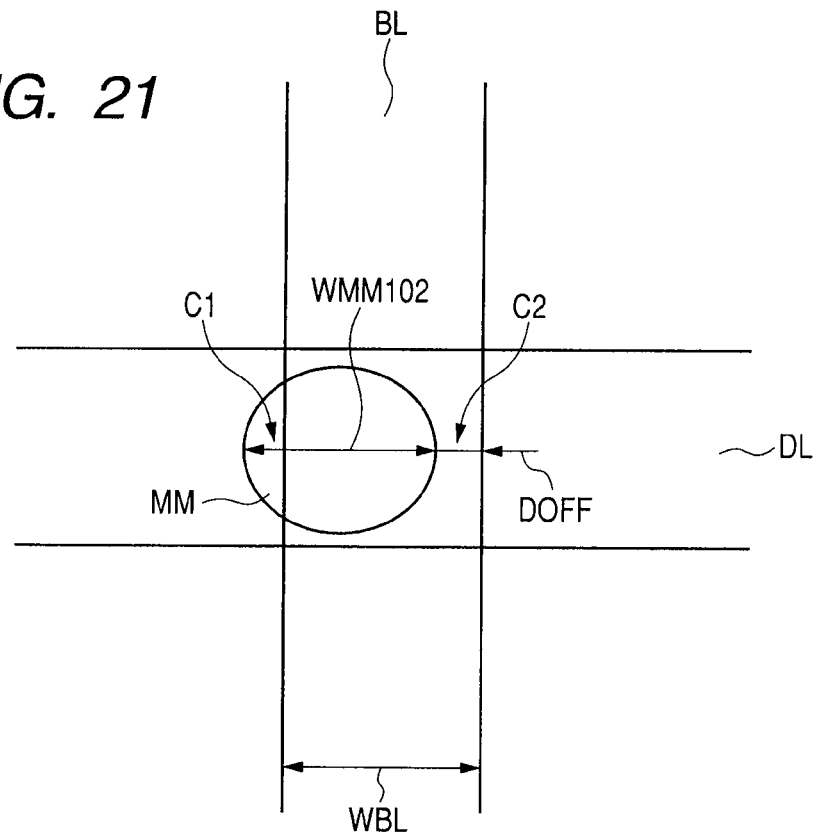
FIG. 21 is a schematic plan view showing the layout of a magnetic memory device when the width of a bit line is equal to or more than that of a magnetic memory element as a further comparative example of the invention.

FIG. 21 is a schematic plan view showing the layout of a magnetic memory device as a comparative example of the invention when the width of a bit line is equal to or more than the width of the magnetic memory element. In formation of the bit line BL, the bit line BL can extend off from the position directly above the magnetic memory element MM due to the misalignment of the bit line BL with respect to the magnetic memory element MM. The misalignment is caused due to the fact that the photoengraving process is inaccurate in forming the hole 40a (see FIG. 4). Referring to FIG. 21, the bit line BL is displaced from the position directly above the magnetic memory element MM only by a distance DOFF. When the width WBL of the bit line BL is equal to or more than the width WMM102 corresponding to the width WMM2 of the magnetic memory element MM, the occurrence of misalignment may tend to generate a region C1 or a region C2. A part of the magnetic memory element MM in the region C1 is displaced from an intersection part between the bit line BL and the digit line DL. Thus, a magnetization direction of the part of the magnetic memory element MM in the region C1 may not be changed by a magnetic field from the bit line BL and the digit line DL. In the region C2, the bit line BL is positioned outside the magnetic memory element MM. Thus, the magnetic field generated by the bit line BL located in the region C2 does not contribute to changing the magnetization direction of the magnetic memory element MM. As a result, the function of the magnetic memory element can be reduced.

In contrast, as shown in FIGS. 1 and 3, in the magnetic memory device of this embodiment, the width WBL of the bit line BL is smaller than the width WMM2 of the magnetic memory element MM. Even when the bit line BL is misaligned with the magnetic memory element MM, the bit line BL is prevented from extending off the position above the magnetic memory element. This prevents the magnetic memory element MM from having a part whose magnetization direction is not changed, and also prevents generation of a magnetic field which does not contribute to changing the magnetization direction of the magnetic memory element MM. As a result, the reduction of function of the magnetic memory element can be suppressed.

According to the magnetic memory device and the manufacturing method thereof of this embodiment, the distance DDL from the upper surface of the digit line DL to the lower surface of the tunnel insulating film IL is smaller than the distance DBL from the upper surface of the tunnel insulating film IL to the lower surface of the bit line BL, which can suppress the reduction of function of the magnetic memory element MM. This mechanism will be described below.

Figure 22:
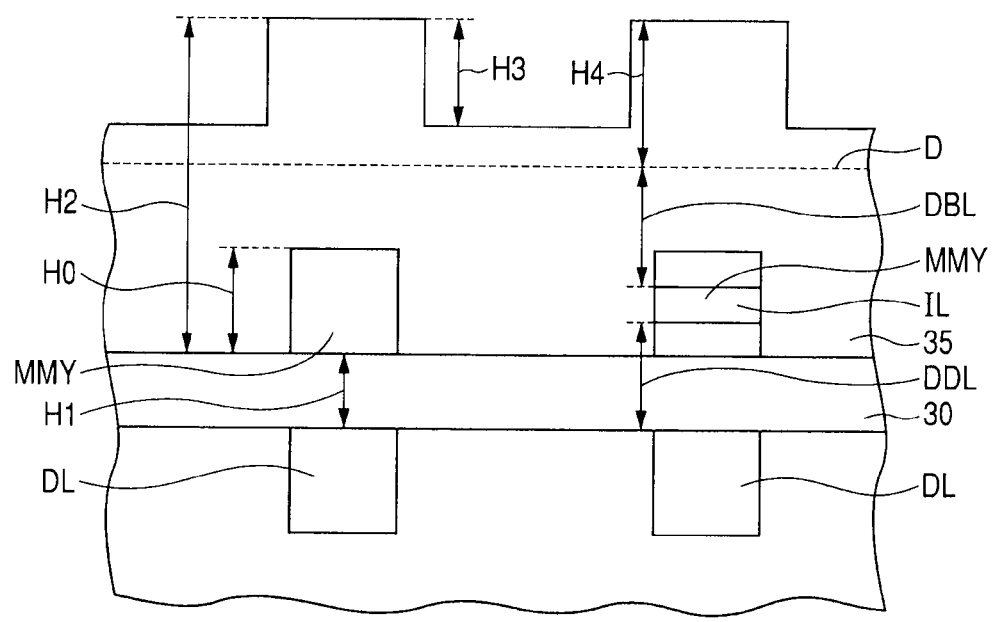
FIG. 22 is a schematic diagram showing a positional relationship among the digit line, the magnetic memory element unit, and the bit line shown in FIG. 17.

FIG. 22 is a schematic diagram showing a positional relationship among the digit line, the magnetic memory element unit, and the bit line shown in FIG. 17. A magnetic memory element unit MMY shown in FIG. 22 corresponds to the structure including a combination of the electrode layer 36, the magnetization fixed layer PL, the tunnel insulating film IL, the magnetization free layer FL, and the electrode layer 38 shown in FIG. 17. Referring to FIG. 22, a stepped portion whose height is represented by a height H3 is generated at the upper surface of the interlayer insulating film 35 directly after forming the interlayer insulating film 35, due to a stepped portion (height HO) generated between the interlayer insulating film 30 and the magnetic memory element unit MMY. The height H3 is, for example, about 100 nm. A distance (length in the lateral direction of FIG. 22) between the adjacent magnetic memory element units MMYs is, for example, about 200 nm. In order to equalize the distance between each of the bit lines BLs formed over the interlayer insulating film 35 and the magnetic memory element MM, it is necessary to planarize the upper surface of the interlayer insulating film 35. In planarizing the upper surface of the interlayer insulating film 35, the interlayer insulating film 35 is removed only by a height H4 (for example, of about 150 to 200 nm) which is 1.5 times or more than the height H3. In order to prevent the removal of the magnetic layer of the magnetic memory element at the time of removing the interlayer insulating film 35, the interlayer insulating film 35 is desired to be formed at the height H2 (for example, of 400 nm) which is at least four times as large as the height HO. The increasing of the distance DBL from the upper surface of the tunnel insulating film IL to the lower surface of the bit line BL results in an uniform distance between each of the bit lines BLs formed over the interlayer insulating film 35 and the magnetic memory element MM. In contrast, the interlayer insulating film 30 does not have any stepped portion formed due to the magnetic memory element unit MMY, and thus has a high flatness as compared to the interlayer insulating film 35. For this reason, the interlayer insulating film 30 is desired to be thin (that is, the distance DDL is desired to be small) so as to effectively exert an influence of a magnetic field generated from the digit line DL on the magnetic memory element MM. Therefore, by making the distance DDL smaller than the distance DBL, the degradation in performance of the magnetic memory element can be prevented.

This embodiment has described the case where both a first arrangement and a second arrangement are achieved. In the first arrangement, the width WDL is larger than the width WMM1, and the width WBL is smaller than the width WMM2. In the second arrangement, the distance DDL is smaller than the distance DBL. However, in the magnetic memory device and the manufacturing method thereof according to the invention, at least one of the first and second arrangements may be included. However, both the first and second arrangements are provided to further improve the controllability of the magnetic memory element MM. This mechanism will be described below.

In order to prevent a malfunction in the magnetic memory element MM due to current noise from the bit line or digit line, it is necessary to strike a balance between the level of a magnetic field applied to the magnetic memory element MM by the digit line DL and the level of a magnetic field applied to the element MM by the bit line BL in an asteroid curved line indicative of a critical value of magnetization reversal of the magnetic memory element MM. Since in this embodiment the width WDL of the digit line DL is large and the width WBL of the bit line BL is small, the density of current of the bit line BL tends to easily become larger than that of the digit line DL, and the level of the magnetic field generated from the bit line BL also tends to become larger than that generated from the digit line DL. On the other hand, since the distance DDL is smaller than the distance DBL, an influence of the magnetic field from the digit line DL on the magnetic memory element MM is larger than that of the magnetic field from the bit line BL on the element MM. Thus, the invention has good balance between the level of the magnetic field applied to the magnetic memory element MM by the digit line DL and the level of the magnetic field applied to the element MM by the bit line BL, and thus can improve the controllability of the magnetic memory element MM.

It is to be understood that the foregoing description of the preferred embodiments of the invention has been presented for the purpose of illustration and example only, and does not limit the invention to the precise form disclosed. The scope of the invention is not limited to the disclosed embodiments, but defined by the claims appended thereto. Many modifications and variations will occur to those skilled in the art. All such modifications and variations are intended to fall within the scope of the appended claims and their equivalents.

The invention is suitably applied to a magnetic memory device including two conductors which can change the magnetized state of the magnetic memory element by a magnetic field generated, and a manufacturing method thereof.

What is claimed is:

1. A magnetic memory device, comprising:
   a magnetic memory element capable of holding data based on a magnetized state; and
   first and second conductors capable of changing the magnetized state by a magnetic field generated,
   wherein the magnetic memory element is disposed above the first conductor and below the second conductor at an intersection part of the first conductor extending in a first direction and the second conductor extending in a second direction,
   wherein the first conductor has a first width at the intersection part in a direction perpendicular to the first direction as viewed planarly,
   wherein the second conductor has a second width at the intersection part in a direction perpendicular to the second direction as viewed planarly,
   wherein the magnetic memory element has a third width in the direction perpendicular to the first direction as viewed planarly, and a fourth width in the direction perpendicular to the second direction as viewed planarly, and
   wherein the first width is larger than the third width, and the second width is smaller than the fourth width.

2. A magnetic memory device, comprising:
   a magnetic memory element capable of holding data based on a magnetized state; and
   first and second conductors capable of changing the magnetized state by a magnetic field generated,
   wherein the magnetic memory element is disposed above the first conductor and below the second conductor at an intersection part of the first conductor extending in a first direction and the second conductor extending in a second direction, wherein the magnetic memory element includes a magnetization fixed layer whose direction of magnetization is fixed, a magnetization free layer whose direction of magnetization is variable, and an intermediate layer provided between the magnetization fixed layer and the magnetization free layer, and wherein a distance from an upper surface of the first conductor to a lower surface of the intermediate layer is smaller than that from an upper surface of the intermediate layer to a lower surface of the second conductor.

3. The magnetic memory device according to claim 2, wherein the first conductor has a first width at the intersection part in a direction perpendicular to the first direction as viewed planarly, wherein the second conductor has a second width at the intersection part in a direction perpendicular to the second direction as viewed planarly, wherein the magnetic memory element has a third width in the direction perpendicular to the first direction as viewed planarly, and a fourth width in the direction perpendicular to the second direction as viewed planarly, and wherein the first width is larger than the third width, and the second width is smaller than the fourth width.

4. The magnetic memory device according to any one of claims 1 to 3, wherein at least one of the first and second conductors includes a conductor body, and a clad layer for increasing a magnetic field generated from current toward the magnetic memory element when the current is allowed to flow through the conductor body.

5. A method for manufacturing a magnetic memory device, said method comprising the steps of:

forming a magnetic memory element capable of holding data based on a magnetized state thereof; and forming first and second conductors capable of changing the magnetized state by a magnetic field generated, wherein the magnetic memory element is disposed above the first conductor and below the second conductor at an intersection part of the first conductor extending in a first direction and the second conductor extending in a second direction, wherein the first conductor has a first width at the intersection part in a direction perpendicular to the first direction as viewed planarly, wherein the second conductor has a second width at the intersection part in a direction perpendicular to the second direction as viewed planarly, wherein the magnetic memory element has a third width in the direction perpendicular to the first direction as viewed planarly, and a fourth width in the direction perpendicular to the second direction as viewed planarly, and wherein the first width is made larger than the third width, and the second width is made smaller than the fourth width.

6. A method for manufacturing a magnetic memory device, said method comprising the steps of:

forming a magnetic memory element capable of holding data based on a magnetized state thereof; and forming first and second conductors capable of changing the magnetized state by a magnetic field generated, wherein the magnetic memory element is disposed above the first conductor and below the second conductor at an intersection part of the first conductor extending in a first direction and the second conductor extending in a second direction, wherein the step of forming the magnetic memory element includes a step of providing an intermediate layer between a magnetization fixed layer whose direction of magnetization is fixed, and a magnetization free layer whose direction of magnetization is variable, and wherein a distance from an upper surface of the first conductor to a lower surface of the intermediate layer is made smaller than that from an upper surface of the intermediate layer to a lower surface of the second conductor.

7. The method for manufacturing a magnetic memory device according to claim 6, wherein the first conductor has a first width at the intersection part in a direction perpendicular to the first direction as viewed planarly, wherein the second conductor has a second width at the intersection part in a direction perpendicular to the second direction as viewed planarly, wherein the magnetic memory element has a third width in the direction perpendicular to the first direction as viewed planarly, and a fourth width in the direction perpendicular to the second direction as viewed planarly, and wherein the first width is made larger than the third width, and the second width is made smaller than the fourth width.

8. The method for manufacturing a magnetic memory device according to any one of claims 5 to 7, wherein the step of forming the first conductor, or the step of forming the second conductor includes the steps of:

forming a conductor body; and forming a clad layer for increasing a magnetic field generated from the conductor body toward the magnetic memory element when current is allowed to flow through the conductor body.

* * * * *